(12) United States Patent
Bishop et al.

(10) Patent No.: US 11,923,654 B2
(45) Date of Patent: Mar. 5, 2024

(54) LASER INTEGRATION TECHNIQUES

(71) Applicant: Apple Inc., Cupertino, CA (US)

(72) Inventors: Michael J. Bishop, San Carlos, CA (US); Jason Pelc, Sunnyvale, CA (US); Vijay M. Iyer, Mammoth Lakes, CA (US); Alex Goldis, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 95 days.

(21) Appl. No.: 17/519,355

(22) Filed: Nov. 4, 2021

(65) Prior Publication Data

US 2022/0131340 A1  Apr. 28, 2022

Related U.S. Application Data

(63) Continuation of application No. 16/714,575, filed on Dec. 13, 2019, now Pat. No. 11,171,464.

(Continued)

(51) Int. Cl.
*H01S 5/02355* (2021.01)
*G02B 6/13* (2006.01)
(Continued)

(52) U.S. Cl.
CPC ............ *H01S 5/02355* (2021.01); *G02B 6/13* (2013.01); *H01S 5/02234* (2021.01);
(Continued)

(58) Field of Classification Search
CPC ... H01S 5/02355; H01S 5/02345; G02B 6/13; G02B 2006/12135
See application file for complete search history.

(56) References Cited

U.S. PATENT DOCUMENTS 4,227,091 A   10/1980   Sick
4,318,058 A    3/1982   Mito
(Continued)

FOREIGN PATENT DOCUMENTS

EP   1753104   2/2007
EP   2091118   8/2009
(Continued)

OTHER PUBLICATIONS

U.S. Appl. No. 18/094,767, filed Jan. 9, 2023, Arbore et al.
(Continued)

*Primary Examiner* — Jay C Chang
*Assistant Examiner* — Mikka Liu
(74) *Attorney, Agent, or Firm* — Brownstein Hyatt Farber Schreck, LLP

(57) ABSTRACT

Described herein are one or more methods for integrating an optical component into an integrated photonics device. The die including a light source, an outcoupler, or both, may be bonded to a wafer having a cavity. The die can be encapsulated using an insulating material, such as an overmold, that surrounds its edges. Another (or the same) insulating material can surround conductive posts. Portions of the die, the overmold, and optionally, the conductive posts can be removed using a grinding and polishing process to create a planar top surface. The planar top surface enables flip-chip bonding and an improved connection to a heat sink. The process can continue with forming one or more additional conductive layers and/or insulating layers and electrically connecting the p-side and n-side contacts of the laser to a source.

18 Claims, 21 Drawing Sheets

Related U.S. Application Data

(60) Provisional application No. 62/779,986, filed on Dec. 14, 2018.

(51) Int. Cl.
*H01S 5/02234* (2021.01)
*H01S 5/02251* (2021.01)
*H01S 5/0234* (2021.01)
*H01S 5/02345* (2021.01)
*G02B 6/12* (2006.01)
*H01S 5/024* (2006.01)

(52) U.S. Cl.
CPC ........ *H01S 5/02251* (2021.01); *H01S 5/0234* (2021.01); *H01S 5/02345* (2021.01); *G02B 2006/12121* (2013.01); *G02B 2006/12135* (2013.01); *G02B 2006/12147* (2013.01); *H01S 5/02469* (2013.01)

(56) References Cited

U.S. PATENT DOCUMENTS

| | | | |
|---|---|---|---|
| 4,880,304 A | 11/1989 | Jaeb | |
| 4,896,325 A | 1/1990 | Coldren | |
| 5,140,605 A | 8/1992 | Paoli | |
| 5,159,700 A | 10/1992 | Reid | |
| 5,287,376 A | 2/1994 | Paoli | |
| 5,319,725 A | 6/1994 | Buchmann et al. | |
| 5,325,392 A | 6/1994 | Tohmori | |
| 5,341,391 A | 8/1994 | Ishimura | |
| 5,384,797 A | 1/1995 | Welch | |
| 5,483,261 A | 1/1996 | Yasutake | |
| 5,488,204 A | 1/1996 | Mead et al. | |
| 5,515,391 A | 5/1996 | Endriz | |
| 5,574,561 A | 11/1996 | Boudreau | |
| 5,695,520 A | 12/1997 | Bruckner et al. | |
| 5,708,674 A | 1/1998 | Berrnink | |
| 5,742,631 A | 4/1998 | Paoli | |
| 5,780,875 A | 7/1998 | Tsuji | |
| 5,825,352 A | 10/1998 | Bisset et al. | |
| 5,835,079 A | 11/1998 | Shieh | |
| 5,850,411 A | 12/1998 | Major, Jr. | |
| 5,880,411 A | 3/1999 | Gillespie et al. | |
| 5,898,806 A | 4/1999 | Nishimoto | |
| 5,915,165 A | 6/1999 | Sun | |
| 6,043,104 A | 3/2000 | Uchida | |
| 6,160,936 A | 12/2000 | You et al. | |
| 6,188,391 B1 | 2/2001 | Seely et al. | |
| 6,250,819 B1 | 6/2001 | Porte | |
| 6,263,222 B1 | 7/2001 | Diab | |
| 6,310,610 B1 | 10/2001 | Beaton et al. | |
| 6,323,846 B1 | 11/2001 | Westerman et al. | |
| 6,341,116 B1 | 1/2002 | Lee | |
| 6,345,135 B1 | 2/2002 | Reid | |
| 6,373,872 B2 | 4/2002 | Deacon | |
| 6,393,185 B1 | 5/2002 | Deacon et al. | |
| 6,475,153 B1 | 11/2002 | Khair et al. | |
| 6,516,017 B1 | 2/2003 | Matsumoto | |
| 6,558,335 B1 | 5/2003 | Thede | |
| 6,605,045 B2 | 8/2003 | Ohsaki et al. | |
| 6,628,686 B1 | 9/2003 | Sargent | |
| 6,643,434 B2 | 11/2003 | Cayrefourcq et al. | |
| 6,647,032 B1 | 11/2003 | Lee et al. | |
| 6,661,955 B1 | 12/2003 | Calvet | |
| 6,690,387 B2 | 2/2004 | Zimmerman et al. | |
| 6,690,693 B1 | 2/2004 | Crowder | |
| 6,699,199 B2 | 3/2004 | Asada et al. | |
| 6,788,719 B2 | 9/2004 | Crowder | |
| 6,795,453 B2 | 9/2004 | Pezeskhi et al. | |
| 6,803,604 B2 | 10/2004 | Takahashi et al. | |
| 6,807,206 B2 | 10/2004 | Tuskiji et al. | |
| 6,816,529 B2 | 11/2004 | Vail | |
| 6,911,629 B2 | 6/2005 | Lano et al. | |
| 6,915,955 B2 | 7/2005 | Jung | |
| 6,987,906 B2 | 1/2006 | Nakama et al. | |
| 6,990,129 B2 | 1/2006 | Buimovich et al. | |
| 7,015,894 B2 | 3/2006 | Morohoshi | |
| 7,106,778 B2 | 9/2006 | Reid | |
| 7,130,325 B2 | 10/2006 | Oh et al. | |
| 7,184,064 B2 | 2/2007 | Zimmerman et al. | |
| 7,189,011 B2 | 3/2007 | Harker | |
| 7,196,355 B2 | 3/2007 | De La Grandiere et al. | |
| 7,283,242 B2 | 10/2007 | Thornton | |
| 7,468,637 B2 | 12/2008 | Braun et al. | |
| 7,469,092 B2 | 12/2008 | Sappey et al. | |
| 7,480,317 B2 | 1/2009 | Hu et al. | |
| 7,483,453 B2 | 1/2009 | Diffily et al. | |
| 7,526,007 B2 | 4/2009 | Chua et al. | |
| 7,558,301 B2 | 7/2009 | Lin et al. | |
| 7,616,110 B2 | 11/2009 | Crump et al. | |
| 7,620,078 B2 | 11/2009 | Mori | |
| 7,663,607 B2 | 2/2010 | Hotelling et al. | |
| 7,664,156 B2 | 2/2010 | Yamazaki | |
| 7,701,985 B2 | 4/2010 | Webster et al. | |
| 7,738,935 B1 | 6/2010 | Turcott | |
| 7,751,658 B2 | 7/2010 | Welch et al. | |
| 7,852,898 B2 | 12/2010 | Yokoyama et al. | |
| 7,885,302 B2 | 2/2011 | Eberhard | |
| 7,903,704 B2 | 3/2011 | Patel et al. | |
| 8,000,368 B2 | 8/2011 | Pezeshki | |
| 8,121,169 B2 | 2/2012 | Nguyen et al. | |
| 8,222,084 B2 | 7/2012 | Dallesasse et al. | |
| 8,259,770 B2 | 9/2012 | Tagansky | |
| 8,279,441 B2 | 10/2012 | Brown | |
| 8,320,763 B2 | 11/2012 | Kim et al. | |
| 8,352,008 B2 | 1/2013 | Kuhn et al. | |
| 8,378,811 B2 | 2/2013 | Crump et al. | |
| 8,405,699 B2 | 3/2013 | Niwa et al. | |
| 8,437,825 B2 | 5/2013 | Dalvi et al. | |
| 8,442,608 B2 | 5/2013 | Pav | |
| 8,457,172 B2 | 6/2013 | Reid et al. | |
| 8,479,122 B2 | 7/2013 | Hotelling et al. | |
| 8,588,266 B2 | 11/2013 | Fujii | |
| 8,618,930 B2 | 12/2013 | Papadopoulos et al. | |
| 8,649,839 B2 | 2/2014 | Chin | |
| 8,750,341 B2 | 6/2014 | Bazzani | |
| 8,774,243 B2 | 7/2014 | Kim et al. | |
| 8,781,548 B2 | 7/2014 | Besko et al. | |
| 8,805,129 B2 | 8/2014 | Han et al. | |
| 8,886,465 B2 | 11/2014 | Cinbis et al. | |
| 8,954,135 B2 | 2/2015 | Yuen et al. | |
| 8,964,806 B2 | 2/2015 | Ensher et al. | |
| 8,995,483 B2 | 3/2015 | Diehl et al. | |
| 9,065,251 B2 | 6/2015 | Fukuda et al. | |
| 9,093,813 B2 | 7/2015 | Pushkarsky et al. | |
| 9,172,211 B2 | 10/2015 | Kuksenkov et al. | |
| 9,209,602 B2 | 12/2015 | Davies et al. | |
| 9,323,012 B1 | 4/2016 | Sun et al. | |
| 9,425,365 B2 | 8/2016 | Kurtin | |
| 9,526,421 B2 | 12/2016 | Papadopoulos et al. | |
| 9,526,431 B2 | 12/2016 | Zakharov et al. | |
| 9,529,160 B2 | 12/2016 | Orcutt et al. | |
| 9,543,736 B1 * | 1/2017 | Barwicz | G02B 6/12002 |
| 9,577,410 B2 | 2/2017 | Yamazaki | |
| 9,595,804 B2 | 3/2017 | Minneman et al. | |
| 9,755,399 B2 | 9/2017 | Tulip | |
| 9,759,652 B2 | 9/2017 | Yu | |
| 9,780,266 B2 | 10/2017 | Lotito et al. | |
| 9,804,027 B2 | 10/2017 | Fish | |
| 9,829,631 B2 | 11/2017 | Lambert | |
| 9,882,073 B2 | 1/2018 | Krasulick et al. | |
| 9,883,824 B2 | 2/2018 | Tiao | |
| 9,888,838 B2 | 2/2018 | Ito et al. | |
| 9,935,426 B2 | 4/2018 | Kaneko | |
| 9,948,063 B2 | 4/2018 | Caneau et al. | |
| 10,004,408 B2 | 6/2018 | Naima | |
| 10,060,788 B2 | 8/2018 | Fei | |
| 10,082,625 B2 | 9/2018 | Budd | |
| 10,098,555 B2 | 10/2018 | Yamaji | |
| 10,168,497 B2 | 1/2019 | Merget | |
| 10,181,696 B2 | 1/2019 | Evans et al. | |
| 10,215,698 B2 | 2/2019 | Han et al. | |
| 10,319,693 B2 | 6/2019 | Lambert | |
| 10,319,878 B2 | 6/2019 | Ulmer et al. | |

(56) References Cited

U.S. PATENT DOCUMENTS

| | | |
|---|---|---|
| 10,413,362 B2 | 9/2019 | Griffin |
| 10,433,739 B2 | 10/2019 | Weekly et al. |
| 10,535,979 B2 | 1/2020 | Audet et al. |
| 10,678,005 B2 | 6/2020 | Kinghorn |
| 10,687,718 B2 | 6/2020 | Allec et al. |
| 10,697,830 B1 | 6/2020 | Kangas et al. |
| 10,788,368 B1 | 9/2020 | Pelc et al. |
| 10,852,492 B1 * | 12/2020 | Vermeulen ............ G02B 6/423 |
| 10,868,407 B2 | 12/2020 | Mathai et al. |
| 10,895,568 B2 | 1/2021 | Barwicz et al. |
| 11,036,015 B2 | 6/2021 | Shikama et al. |
| 11,158,996 B2 | 10/2021 | Bismuto et al. |
| 11,171,464 B1 | 11/2021 | Bishop et al. |
| 11,181,702 B2 | 11/2021 | Chen et al. |
| 11,275,405 B2 | 3/2022 | Hotelling |
| 11,385,409 B2 | 7/2022 | Ishikawa |
| 11,409,059 B1 | 8/2022 | Vermeulen |
| 11,437,779 B2 | 9/2022 | Audet et al. |
| 11,493,705 B2 | 11/2022 | Shikama |
| 11,552,454 B1 | 1/2023 | Arbore et al. |
| 11,644,618 B2 | 5/2023 | Bishop et al. |
| 11,686,906 B1 | 6/2023 | Venkatesan |
| 2001/0055447 A1 | 12/2001 | Delprat et al. |
| 2002/0181521 A1 | 12/2002 | Crowder et al. |
| 2004/0126117 A1 | 7/2004 | Lo et al. |
| 2004/0174915 A1 | 9/2004 | Sarlet et al. |
| 2004/0255318 A1 | 12/2004 | Braitberg et al. |
| 2005/0169327 A1 | 8/2005 | Eden et al. |
| 2006/0088068 A1 | 4/2006 | Farrell et al. |
| 2007/0116076 A1 | 5/2007 | Wang et al. |
| 2008/0063016 A1 | 3/2008 | Bhatia et al. |
| 2008/0310470 A1 | 12/2008 | Ooi et al. |
| 2013/0292571 A1 | 11/2013 | Mukherjee et al. |
| 2015/0097211 A1 * | 4/2015 | Krasulick ............ H01S 5/0237 257/184 |
| 2016/0296173 A1 | 10/2016 | Culbert |
| 2017/0033531 A1 | 2/2017 | Treese et al. |
| 2017/0045450 A1 | 2/2017 | Lieber et al. |
| 2017/0168242 A1 * | 6/2017 | Adderly .................. G02B 6/13 |
| 2017/0249445 A1 | 8/2017 | Devries et al. |
| 2017/0325744 A1 | 11/2017 | Allec et al. |
| 2018/0054038 A1 | 2/2018 | Kim |
| 2018/0083421 A1 | 3/2018 | Audet et al. |
| 2018/0242892 A1 | 8/2018 | Schie |
| 2020/0153202 A1 | 5/2020 | Audet et al. |
| 2020/0227895 A1 | 7/2020 | Takigawa et al. |
| 2022/0006267 A1 | 1/2022 | Bismuto et al. |
| 2023/0076055 A1 | 3/2023 | Vallance et al. |
| 2023/0102867 A1 | 3/2023 | Kawabe et al. |
| 2023/0163573 A1 | 5/2023 | Arbore et al. |

FOREIGN PATENT DOCUMENTS

| | | |
|---|---|---|
| EP | 2120301 | 11/2009 |
| EP | 2849294 | 3/2015 |
| EP | 2992821 | 3/2016 |
| GB | 2380058 | 3/2003 |
| JP | 04116878 | 4/1992 |
| JP | 2000163031 | 6/2000 |
| JP | 2002342033 | 11/2002 |
| JP | 2005175021 | 6/2005 |
| JP | 2008262116 | 10/2008 |
| JP | 201503987 | 2/2010 |
| JP | 2015115411 | 6/2015 |
| WO | WO 96/011416 | 4/1996 |
| WO | WO 05/091036 | 9/2005 |
| WO | WO 08/033251 | 3/2008 |
| WO | WO 16/144831 | 9/2016 |
| WO | WO 16/176364 | 11/2016 |
| WO | WO 17/197033 | 11/2017 |

OTHER PUBLICATIONS

U.S. Appl. No. 18/103,186, filed Jan. 30, 2023, Greening.

He et al., "Integrated Polarization Compensator for WDM Waveguide Demultiplexers," *IEEE Photonics Technology Letters* vol. 11, No. 2, Feb. 1999, pp. 224-226.

Lee, S.K. et al. (Apr. 1985). "A Multi-Touch Three Dimensional Touch-Sensitive Tablet," Proceedings of CHI: ACM Conference on Human Factors in Computing Systems, pp. 21-25.

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Tohmori, et al., "Broad-Range Wavelength-Tunable Superstructure Grating (SSG) DBR Lasers," IEEE Journal of Quantum Electronics, vol. 29, No. 6, Jun. 1993, pp. 1817-1823.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

\* cited by examiner

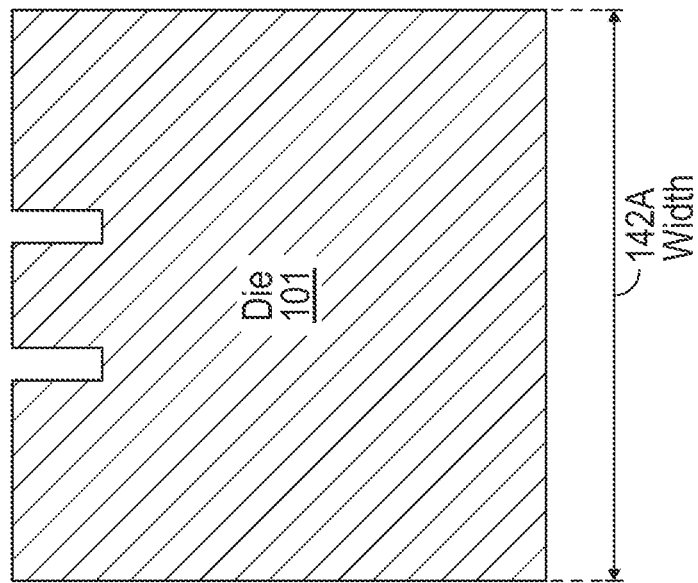
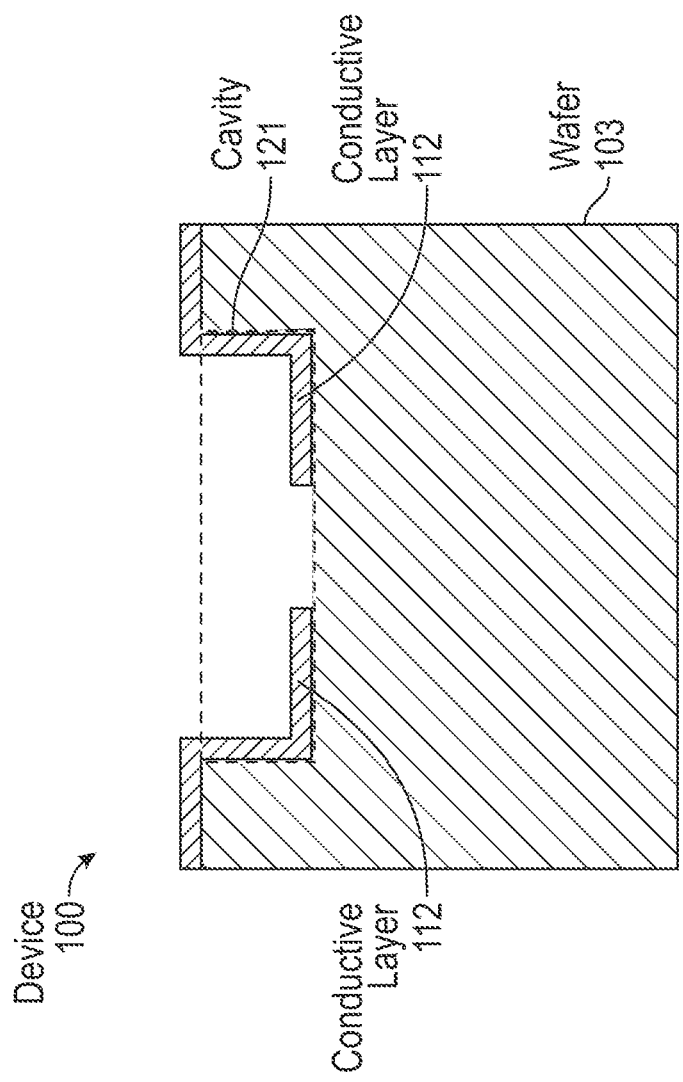

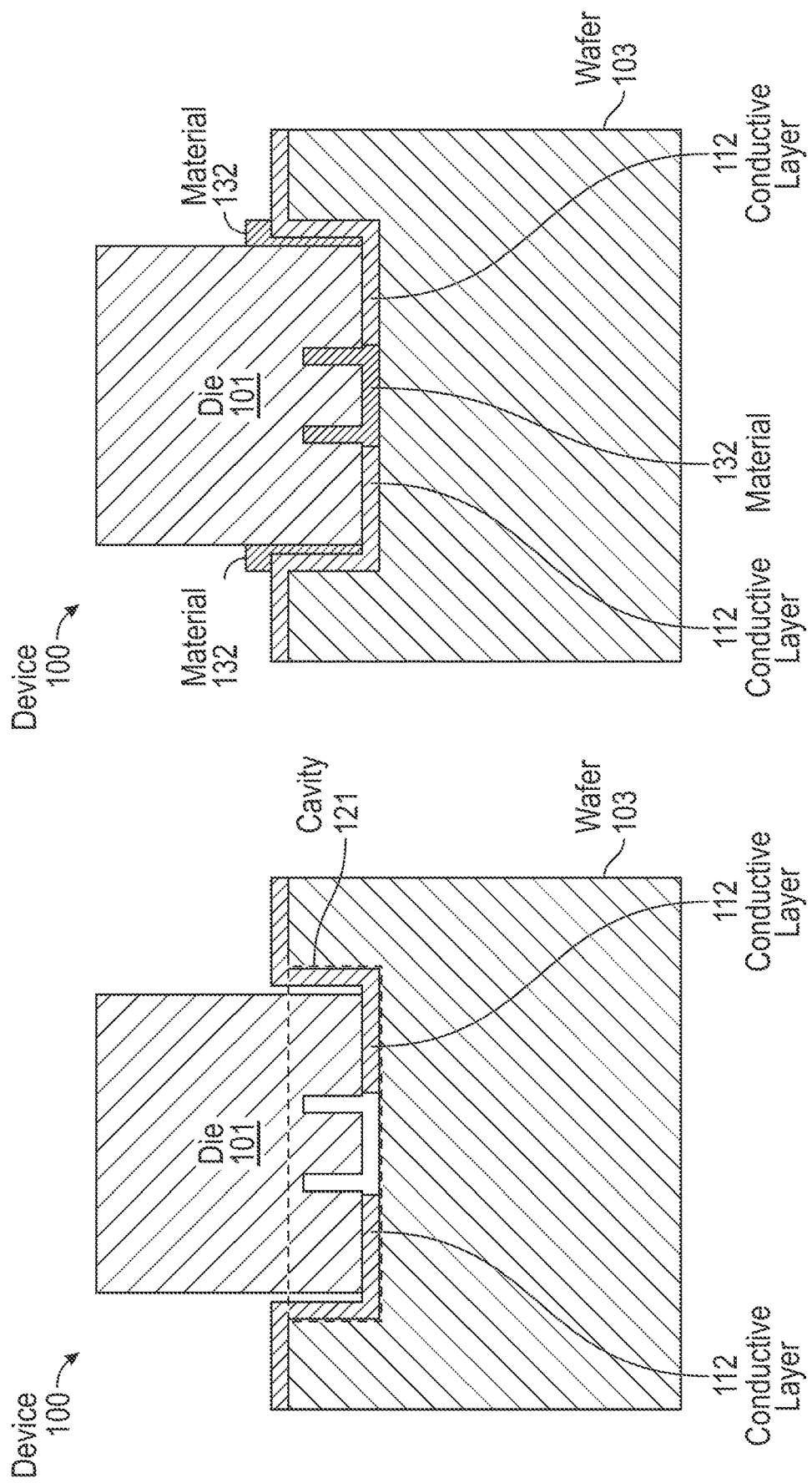

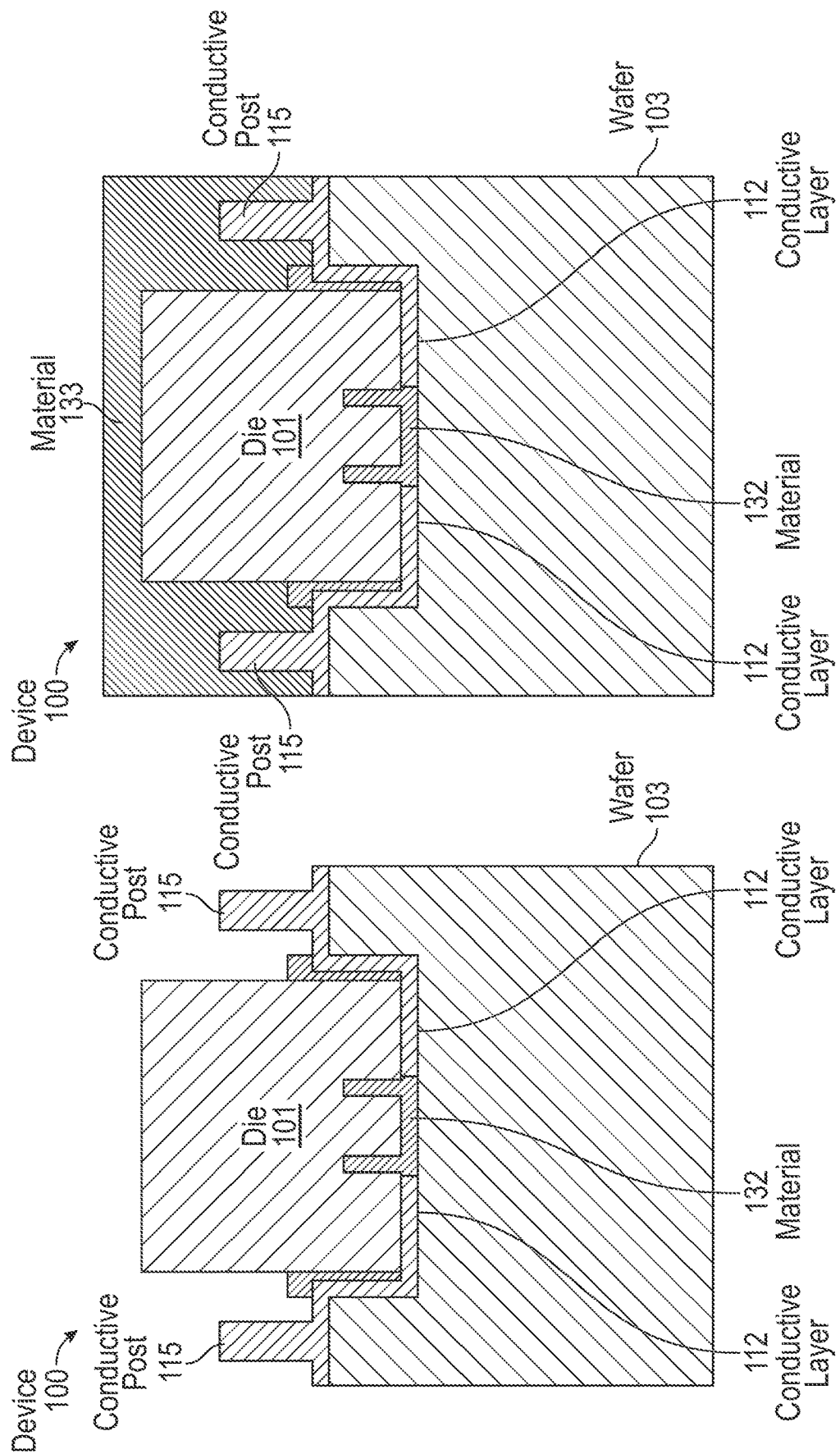

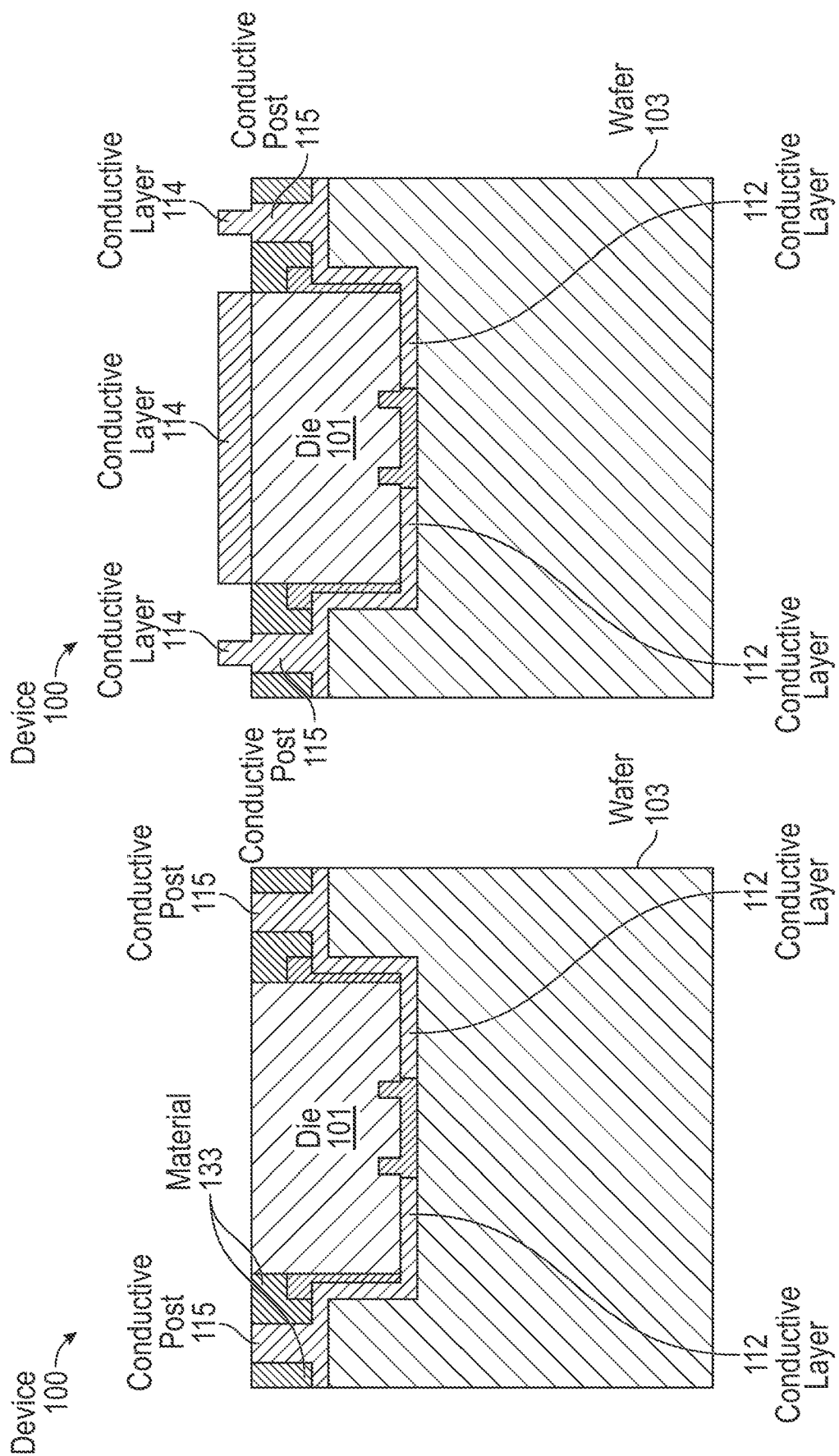

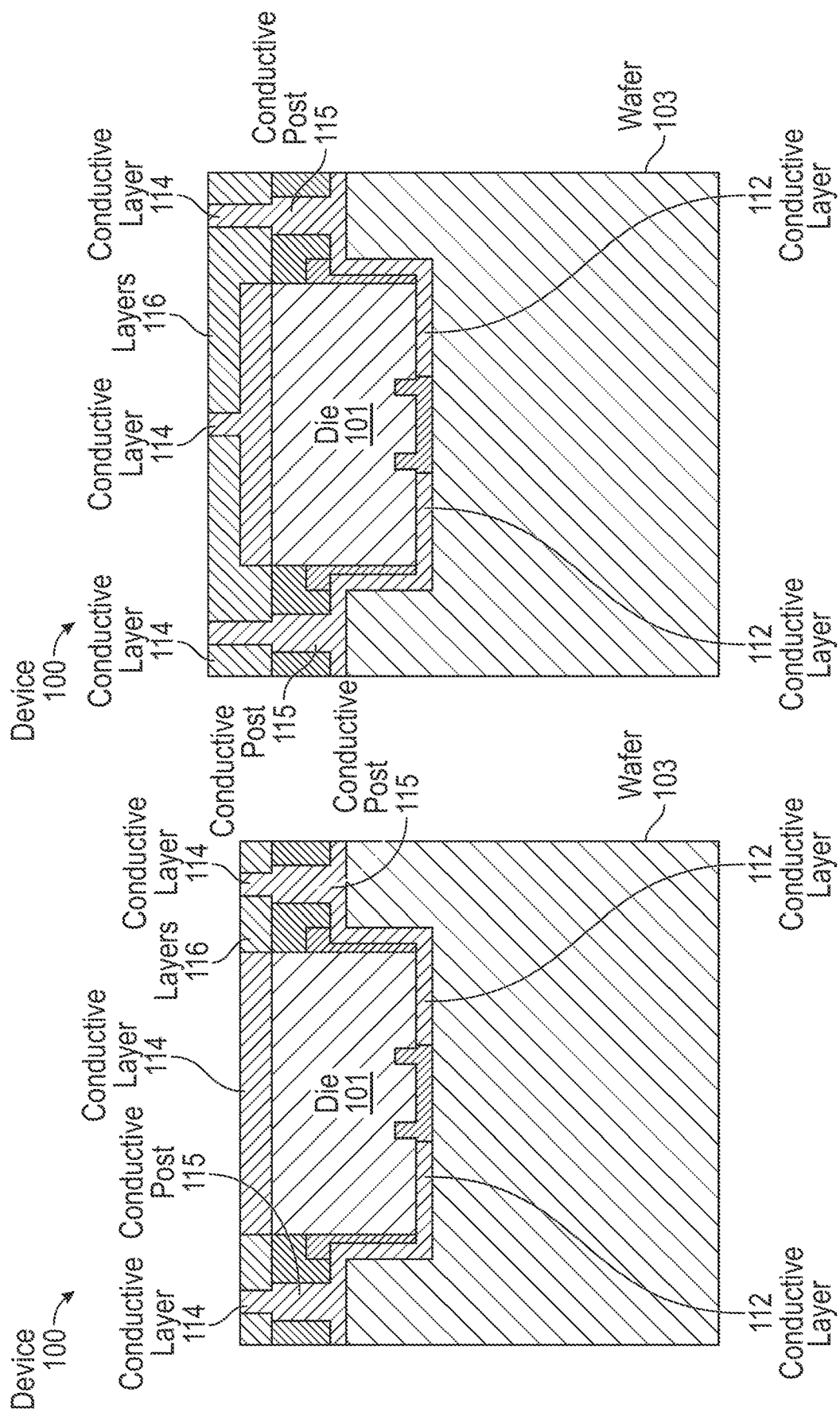

LASER INTEGRATION TECHNIQUES

CROSS-REFERENCE TO RELATED APPLICATIONS

This application is a continuation of U.S. patent application Ser. No. 16/714,575, filed Dec. 13, 2019, which claims the benefit under 35 U.S.C. § 119(e) of U.S. Patent Application No. 62/779,986, filed Dec. 14, 2018, the contents of which are herein incorporated by reference in its entirety for all purposes.

FIELD

This disclosure relates to one or more methods for integrating at least a portion of a laser in a photonics integrated circuit.

BACKGROUND

Optical sensing systems can include photonics devices. In some instances, a photonics device can include a photonics integrated circuit (PIC). One component in the PIC can be a laser. The placement and integration of the laser can affect the performance of the laser and the device. For example, an optimal location and integration of the laser can lead to good thermal performance. The fabrication process used may also affect its cost, yield, and manufacturing time.

Another component in the PIC can be an outcoupler. The outcoupler can be integrated into the photonics device using a similar fabrication process for the integration of the laser.

SUMMARY

Described herein are one or more integration methods for an integrated photonics device. The integrated photonics device can include an optical chip, which can be a PIC, and an electrical chip. The optical chip can be a die including at least a portion of a light source, such as a laser, used to generate light. The generated light can propagate through one or more waveguides to one or more outcouplers. The outcoupler(s) can redirect the light to optics, which can then collimate, focus, and/or direct the light to a launch region located on an external surface of the device.

The electrical chip can include a plurality of conductive layers and insulating layers that can be deposited on a wafer and/or the device after the light source is integrated. The plurality of conductive layers and insulating layers can be used to route one or more signals to the light source.

The light source can include an n-layer and a p-layer. The die which may include a light source, an outcoupler, or both, can be bonded to a wafer. In some examples, the p-layer of the light source can be bonded closer to the bottom of the cavity of the wafer. In some instances, at least a portion of the laser can be located within the cavity. A heat sink can be located on the other side of the bottom of the cavity such that the n-layer of the light source is located proximate to the heat sink. The proximity of the n-layer of the light source to the heat sink can create a shorter thermal path, which can enhance thermal contact and heating spreading. The enhanced thermal contact and heating spreading can reduce any thermally-induced performance degradation of the light source.

A first conductive layer can be located within the wafer. In some examples, a first portion of the first conductive layer can be deposited within the cavity, and a second portion of the first conductive layer can be deposited outside of the cavity.

In some examples, an optical fill material, such as an epoxy, can be added to fill the regions between the die and the cavity. In other examples, an epoxy can be added to seal the edges, defined by the plurality of ledges, around the die. The edges can include an etched facet of the laser, for example. Conductive posts can be formed such that electrical contact is made with the first conductive layer.

The die can be encapsulated using an insulating material, such as an overmold, that surrounds its edges. Another (or the same) insulating material can surround the conductive posts. Portions of the die, the overmold, and optionally, the conductive posts can be removed using, e.g., grinding and polishing processes. In some examples, the portion of the die, the portion of the overmold, and the portion of the plurality of conductive posts can be removed simultaneously in one step. The grinding and polishing process can create a planar top surface. The removal of portions of the die can reduce the thermal path to the heat sink, and the planar surface may facilitate a later bonding process, such as flip-chip bonding. The process can continue with forming one or more additional conductive layers and/or insulating layers and electrically connecting the p-side and n-side contacts of the laser to a source.

DETAILED DESCRIPTION

Figure 1A:
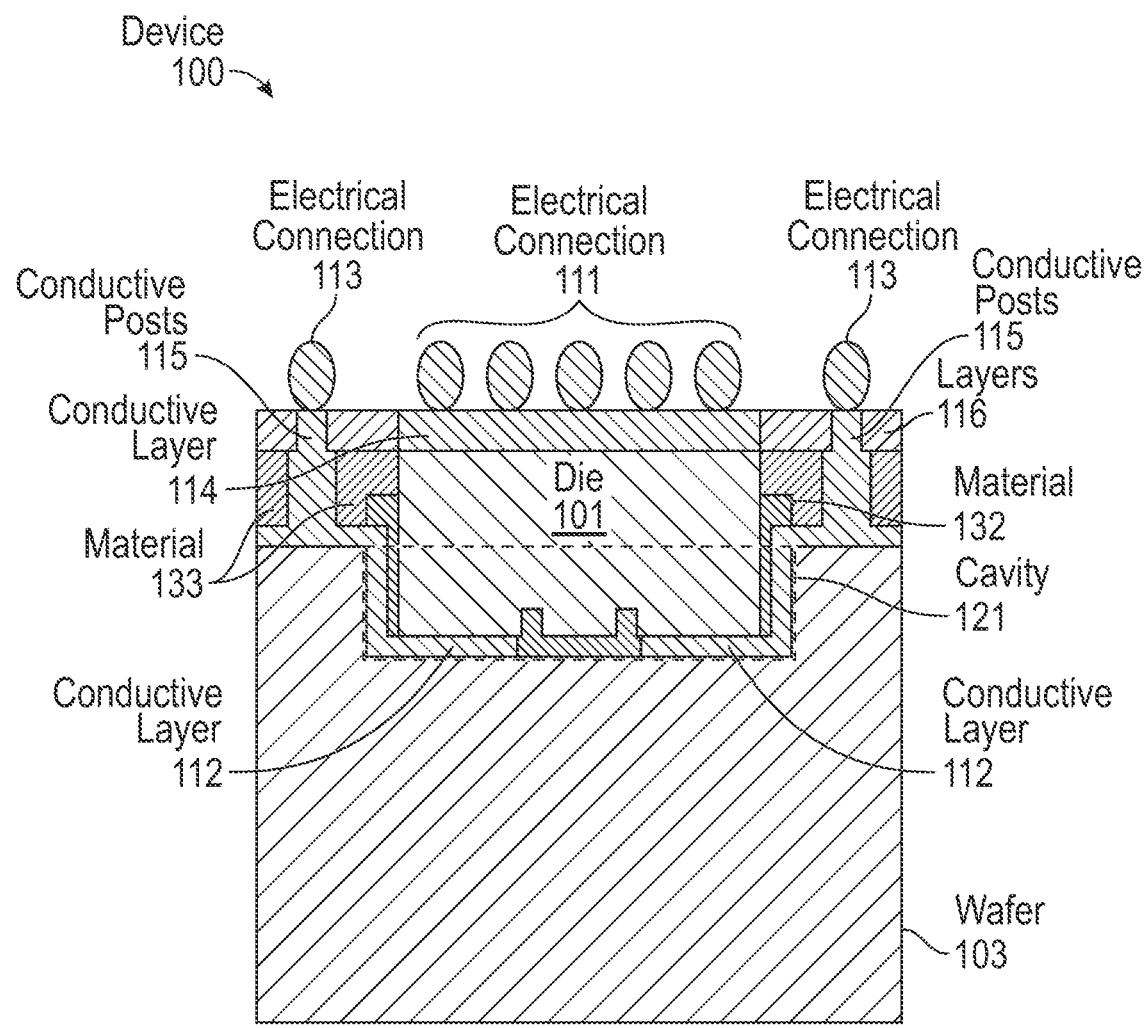
FIGS. 1A-1B illustrate cross-sectional views of example light sources integrated into integrated photonics devices according to examples of the disclosure.

In the following description of examples, reference is made to the accompanying drawings in which it is shown by way of illustration specific examples that can be practiced. It is to be understood that other examples can be used and structural changes can be made without departing from the scope of the various examples.

Various techniques and process flow steps will be described in detail with reference to examples as illustrated in the accompanying drawings. In the following description, numerous specific details are set forth in order to provide a thorough understanding of one or more aspects and/or features described or referenced herein. It will be apparent, however, to one skilled in the art, that one or more aspects and/or features described or referenced herein may be practiced without some or all of these specific details. In other instances, well-known process steps and/or structures have not been described in detail in order to not obscure some of the aspects and/or features described or referenced herein.

Further, although process steps or method steps can be described in a sequential order, such processes and methods can be configured to work in any suitable order. In other words, any sequence or order of steps that can be described in the disclosure does not, in and of itself, indicate a requirement that the steps be performed in that order. Further, some steps may be performed simultaneously despite being described or implied as occurring non-simultaneously (e.g., because one step is described after the other step). Moreover, the illustration of a process by its description in a drawing does not imply that the illustrated process is exclusive of other variations and modification thereto, does not imply that the illustrated process or any of its steps are necessary to one or more of the examples, and does not imply that the illustrated process is preferred.

Described herein are one or more integration methods for an integrated photonics device. The integrated photonics device can include an optical chip, which can be a PIC, and an electrical chip. The optical chip can be a die including at least a portion of a light source, such as a laser, used to generate light. The generated light can propagate through one or more waveguides to one or more outcouplers. The outcoupler(s) can redirect the light to optics, which can then collimate, focus, and/or direct the light to a launch region located on an external surface of the device.

The electrical chip can include a plurality of conductive layers and insulating layers that can be deposited on a wafer and/or the device after the light source is integrated. The plurality of conductive layers and insulating layers can be used to route one or more signals to the light source.

The light source can include an n-layer and a p-layer. The die including a light source, an outcoupler, or both, can be bonded to a wafer. In some examples, the p-layer of the light source can be bonded closer to the bottom of the cavity of the wafer. In some instances, at least a portion of the laser can be located within the cavity. A heat sink can be located on the other side of the bottom of the cavity such that the n-layer of the light source is located proximate to the heat sink. The proximity of the n-layer of the light source to the heat sink can create a shorter thermal path, which can enhance thermal contact and heating spreading. The enhanced thermal contact and heating spreading can reduce any thermally-induced performance degradation of the light source.

A first conductive layer can be located within the wafer. In some examples, a first portion of the first conductive layer can be deposited within the cavity, and a second portion of the first conductive layer can be deposited outside of the cavity. In other examples, the first conductive layer can be one of the layers, such as a silicon on insulator (SOI) layer, of the wafer.

In some examples, an optical fill material, such as an epoxy, can be added to fill the regions between the die and the cavity. In other examples, an epoxy can be added to seal the edges around the die. The edges can include an etched facet of the laser, for example. Conductive posts can be formed such that electrical contact is made with the first conductive layer.

The die can be encapsulated using an insulating material, such as an overmold, that surrounds its edges. Another (or the same) insulating material can surround the conductive posts. Portions of the die, the overmold, and optionally, the conductive posts can be removed using, e.g., grinding and polishing processes. In some examples, the portion of the die, the portion of the overmold, and the portion of the plurality of conductive posts can be removed simultaneously in one step. The grinding and polishing process can create a planar top surface. The removal of portions of the die can reduce the thermal path to the heat sink, and the planar surface may facilitate with a later bonding process, such as flip-chip bonding. The process can continue with forming one or more additional conductive layers and/or insulating layers and electrically connecting the p-side and n-side contacts of the laser to a source.

Configuration and Operation of an Example Integrated Light Source

Figure 1B:
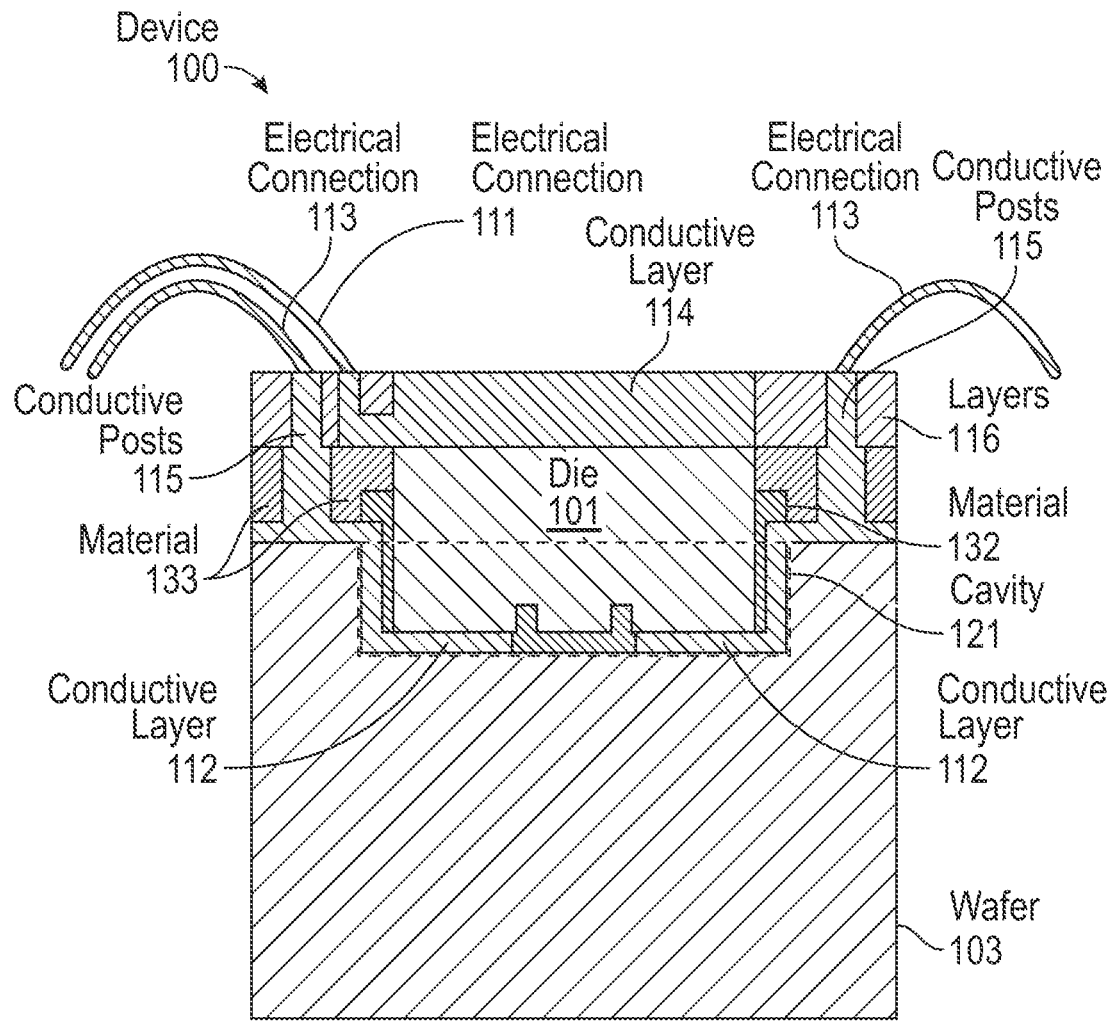

FIGS. 1A-1B illustrate cross-sectional views of example light sources integrated into integrated photonics devices according to examples of the disclosure. The device 100 can include a die 101. The die 101 can form at least a portion of one or more light sources, such as a laser, and can be located at least partially in a cavity 121 of a wafer 103. The wafer 103 can include one or more layers not shown, such as a supporting layer, a SOI layer, a buried oxide (BOX) layer, etc. The details of these layers are not germane to the invention, and as such, are not provided in this disclosure.

The die 101 can be bonded to the bottom of the cavity 121. Prior to bonding, one or more conductive layers 112 (e.g., first conductive layer) can be formed within the wafer 103. The conductive layer 112 can include one or more portions that electrically contact the die 101 and can be used to route electrical signals from a source (e.g., a current source) to the die 101. The source can be located outside of the cavity 121, and as such, the conductive layer 112 can route signals from outside of the cavity 121 to inside the cavity 121. In some examples, the conductive layer 112 can include conductive material for electrically connecting the light source to one or more electrical connections 113. The conductive layers 112 may, in some instances, include one or more materials different from those of the electrical connection 113.

The device 100 may also include one or more conductive layers 114 for electrically connecting the light source to one or more electrical connections. The electrical connection 111 and the electrical connection 113 can be used to route one or more signals from, e.g., a source (not shown) to the contacts of the light source. In some instances, the electrical connection 111 and the electrical connection 113 can be used to propagate one or more signals to control the light source. For example, one or more signals can be used to cause the light source to emit light having one or more properties. Example materials for the conductive layers 112, the electrical connection 111, and the electrical connection 113 can include, but are not limited to, gold, aluminum, and copper.

The electrical connection 111 and the electrical connection 113 can be any type of electrical connection and can be formed using any technique. For example, as shown in FIG. 1A, the electrical connection 111 and the electrical connection 113 can be solder bumps; and as shown in FIG. 1B, the electrical connection 111 and the electrical connection 113 can be wire bonds.

The die 101 can be fabricated separately and, optionally, concurrently with the growth of the wafer 103 and the formation of the cavity 121, thereby decreasing the amount of time for fabricating the device. In some examples, the light source can include one or more III-V materials, and the wafer 103 can include one or more other types of materials, such as silicon; each of which can optionally be fabricated at separate and dedicated foundries.

The device 100 can also include a material 132 (e.g., first insulating material) located between the die 101 and one or more walls (including the bottom) of the cavity 121. The material 132 can include an insulating material, such as flowable oxide, having a low optical loss. The material 132 can be an optical fill material used for reducing optical losses between the die 101 (which, in some instances, can be one type of material, such as a III-V material) and the wafer 103 (which, in some instances, can be another type of material, such as silicon). In some examples, the material 132 can be an index-matching epoxy. The material 132 can be, e.g., a type of epoxy selected based on the emission wavelength of the light source included in the die 101. In some instances, the material 132 can be located around multiple edges of the die 101. In some examples, the material 132 can be used to encapsulate (e.g., surround all sides of the die 101 after the die is bonded to the bottom of the cavity) the conductive layers 112.

Additionally, the device 100 can include a plurality of conductive posts 115 and a material 133 (e.g., second insulating material) surrounding the conductive posts 115 to encapsulate them. The material 132 can be different from the material 133, in some instances. The device 100 can further include one or more layers 116, where the die 101 can be located between the layers 116 and the wafer 103.

Fabrication of an Example Integrated Light Source

Figure 2K:
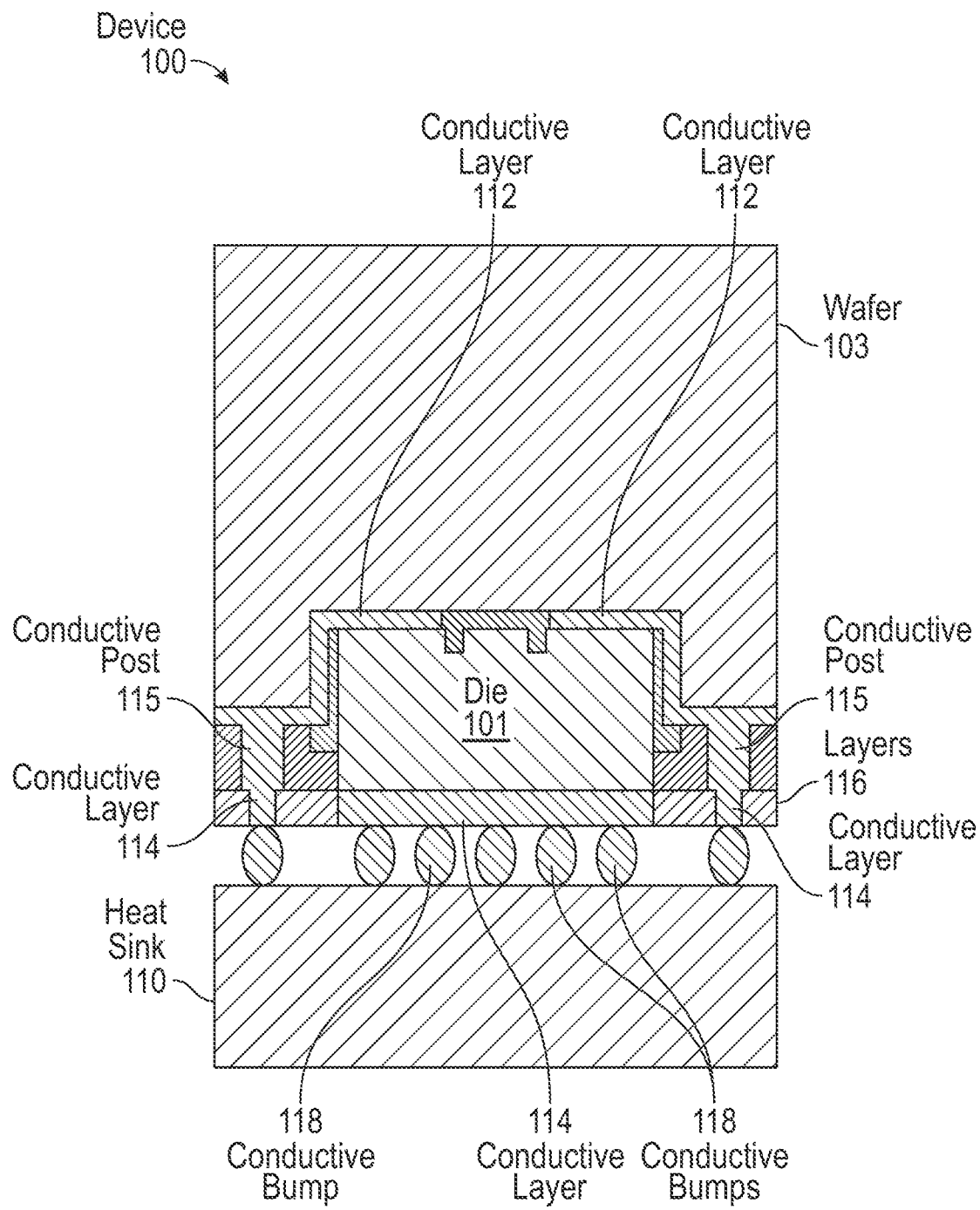
FIGS. 2A-2O illustrate cross-sectional views of a portion of an example integrated photonics device during fabrication according to examples of the disclosure.
Figure 2L:
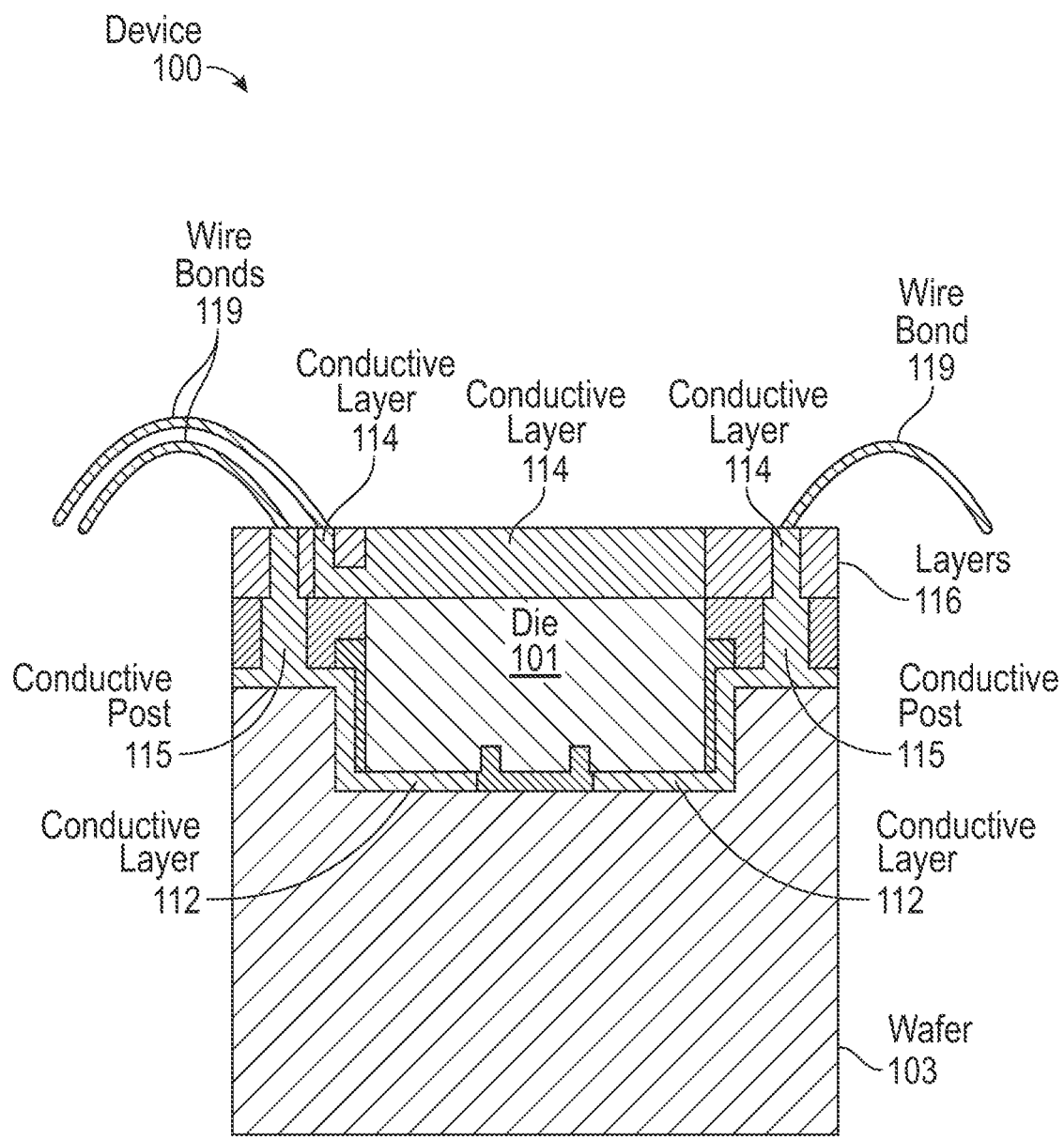
Figure 2M:
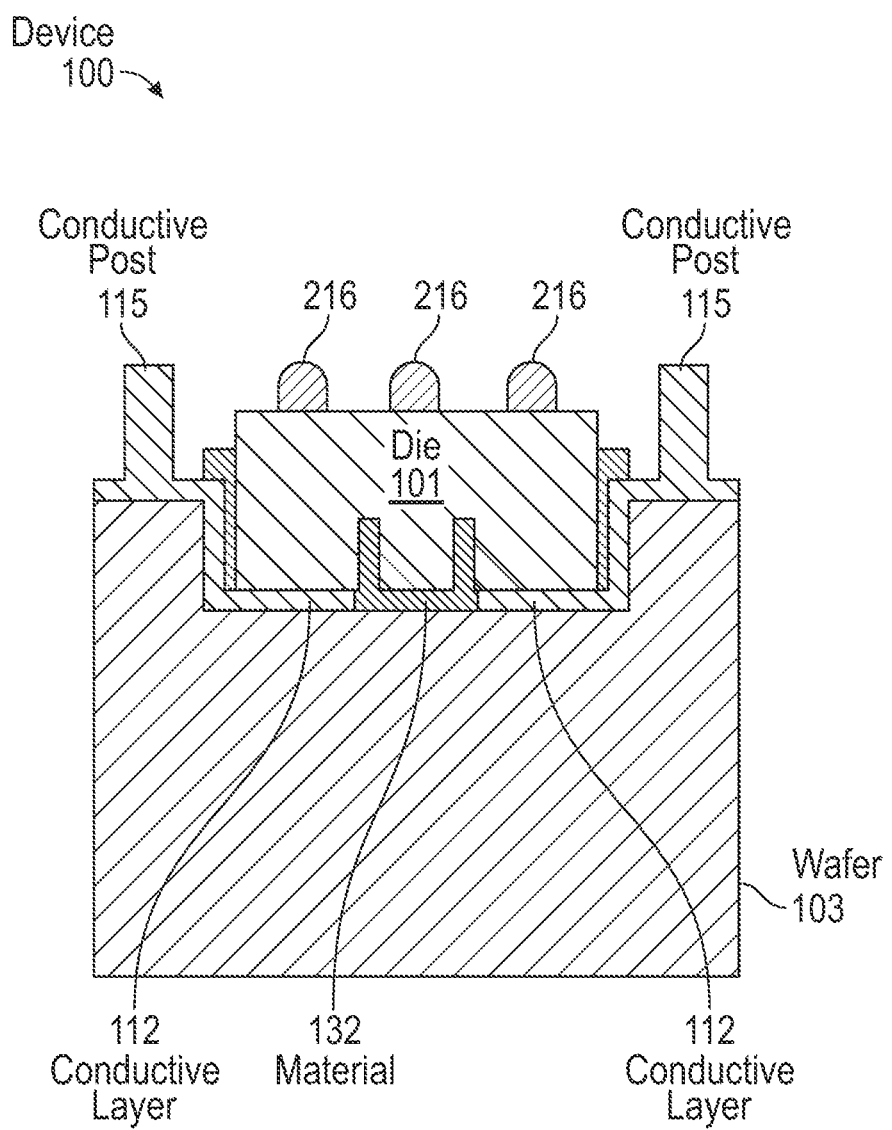
Figure 2N:
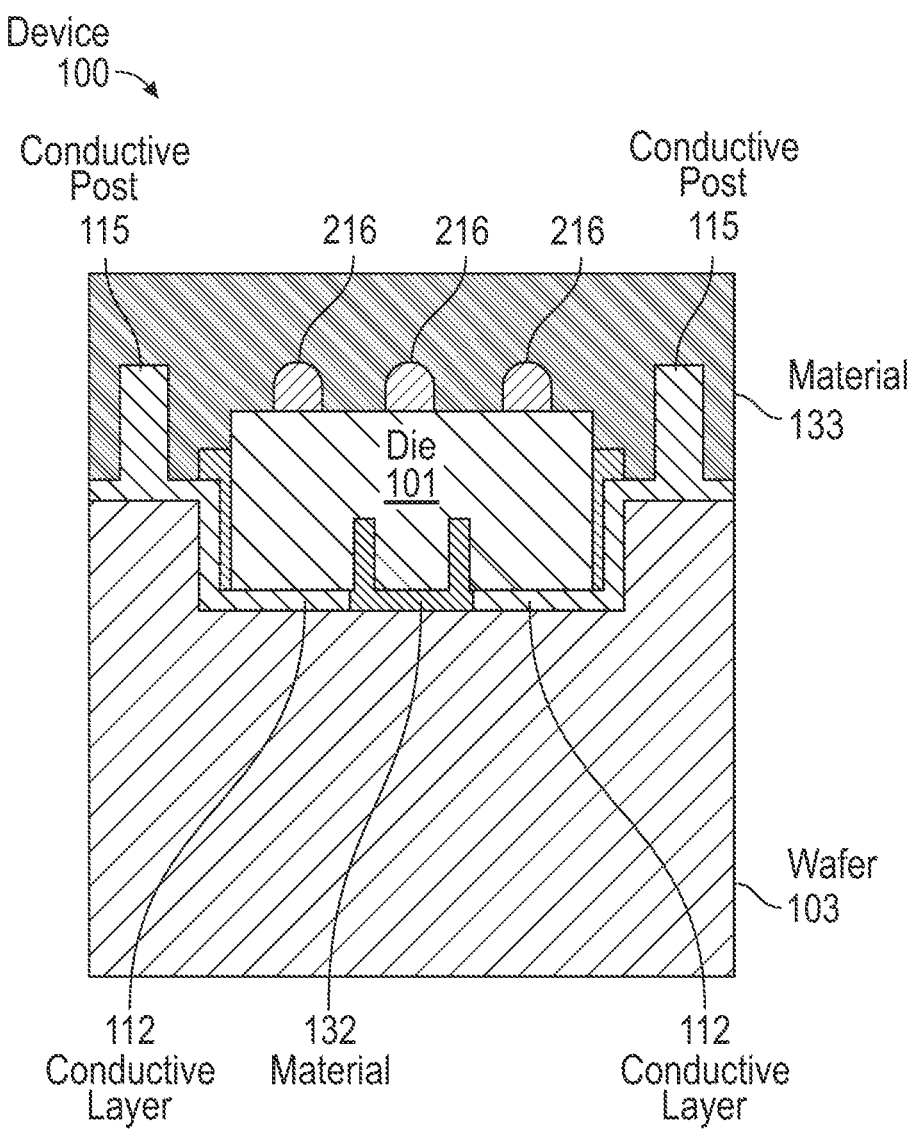
Figure 2O:
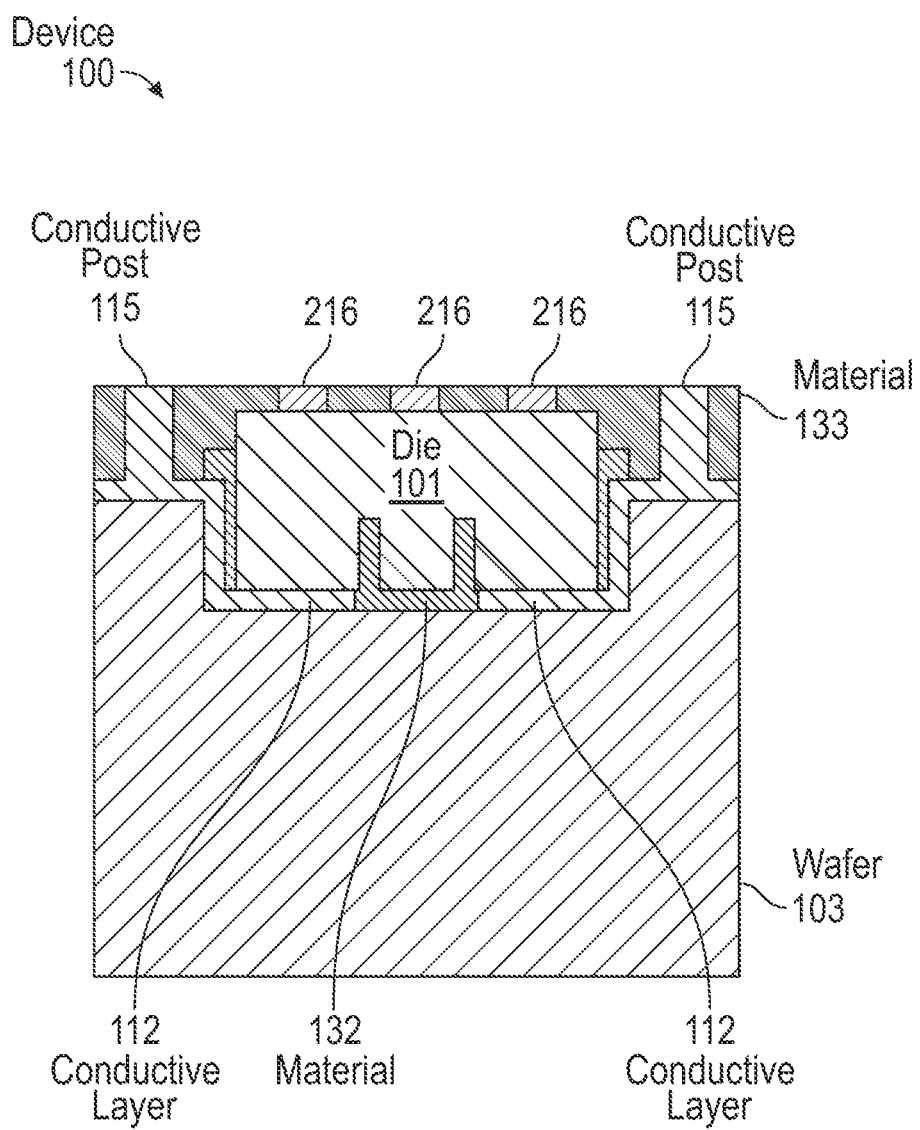
Figure 3:
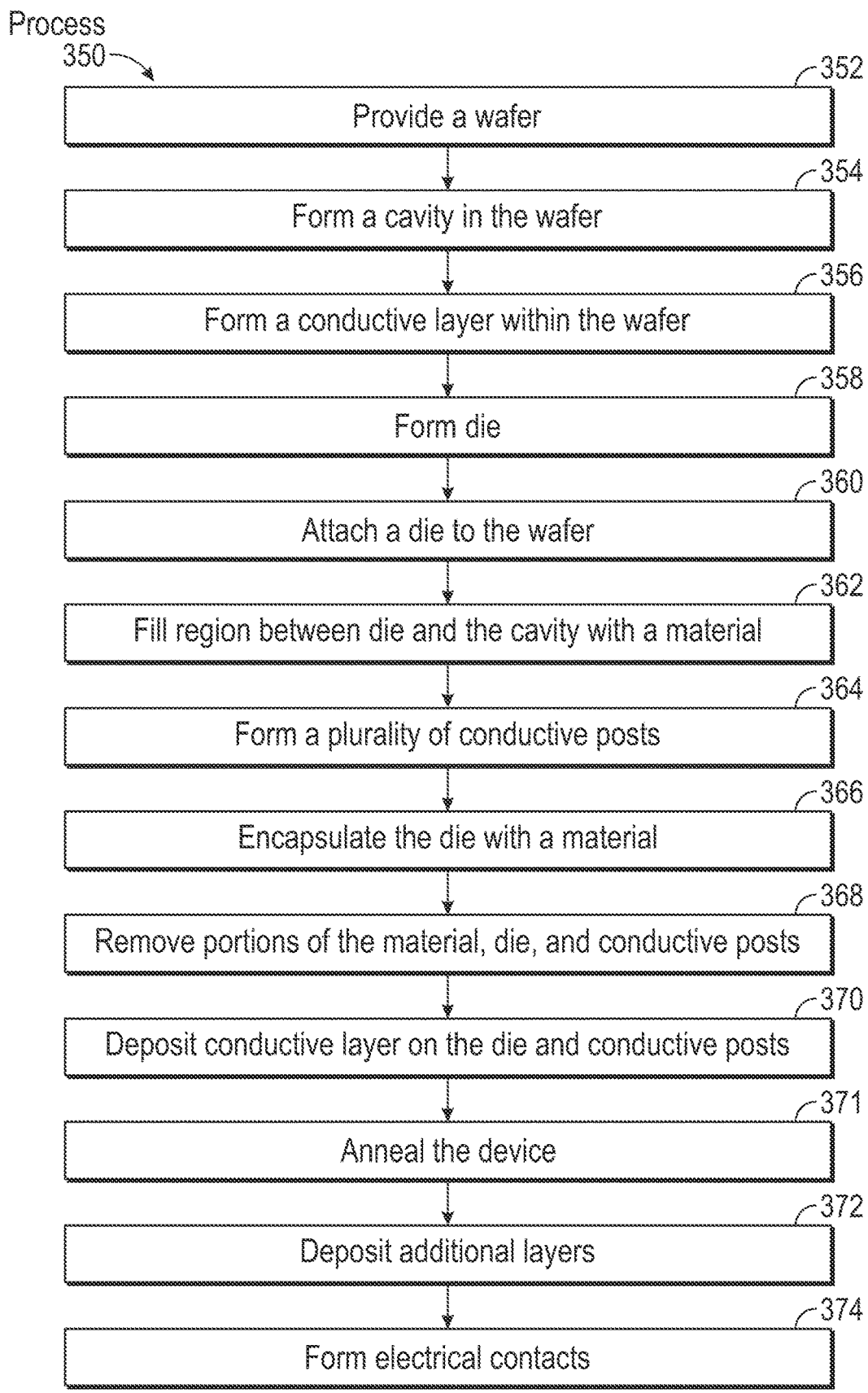
FIG. 3 illustrates an example process flow for fabricating a portion of an integrated photonics device according to examples of the disclosure.

FIGS. 2A-2O illustrate cross-sectional views of a portion of an example integrated photonics device during fabrication, and FIG. 3 illustrates a corresponding example process flow, according to examples of the disclosure. Process 350 can begin by providing a wafer 103, as shown in FIG. 2A (step 352 of process 350). In some examples, the wafer 103 can include a substrate, such as a silicon substrate.

A cavity 121 can be formed in the wafer 103 (step 354 of process 350). The depth (e.g., the distance from the top of the wafer 103 to the bottom of the cavity 121) of the cavity 121 can be based on the targeted height of the die 101, the targeted height of the conductive posts 115, the targeted height of the material 133, or a combination thereof. In some examples, the depth of the cavity 121 may be approximately 7 microns. In other examples, the depth of the cavity 121 may be in the approximate range of less than 1 micron to 20 microns. In some examples, the die may be in the range of approximately 200 microns by 200 microns (200 microns square) to 2 millimeters by 2 millimeters (2 millimeters square). The targeted height can refer to the height of the respective component after the grinding and polishing processes performed in step 368. The width of the cavity 121 can be based on the width of the die 101 (e.g., width 142A of FIG. 2B). In some examples, the width of the cavity 121 can be greater than the width of the die. The cavity 121 can be formed using any type of etching technique.

A conductive layer 112 can be formed within the wafer 103 (step 356 of process 350). In some examples, the cavity 121 may be located within the wafer 103, and a conductive layer 112 can be formed both inside and outside the cavity 121. The conductive layer 112 can be such that a continuous electrical path can exist from the inside of the cavity 121 to the outside of the cavity 121. In some instances, the conductive layer 112 can be patterned into two spatially separated conductive portions, where the conductive portions can later electrically connect to spatially-separated conductive posts 115. In some examples, the conductive layer 112 can be configured as electrical conductive paths for the p-side contacts of the light source. The conductive layer 112 can be formed using any type of deposition, and optionally, any type of patterning technique.

In step 358, a die 101 including a light source can be formed, as shown in FIG. 2B. The die 101 can include a plurality of layers (not shown) such as a p-layer, quantum well layers, an n-layer, and other layers of a light source (e.g., an etch stop layer). One or more steps may include depositing a layer of conductive material such that the conductive layer 112 (shown in FIG. 2A) may electrically connect to the p-layer of the laser. Although not illustrated in the figure, forming the die 101 can include epitaxially growing a plurality of light sources on a single wafer and separating the light sources into multiple die using a dicing process, for example. The die 101 can also be patterned to form, e.g., one or more ridges for the light source.

FIG. 2C illustrates step 360 where the die 101 can be flipped over and attached to the wafer 103 using any type of bonding process. The die 101 can be flipped over such that the p-side contact of the light source can electrically connect to the conductive layer 112 (formed in step 356). In this manner, the light source can be bonded p-side down. After the die 101 is bonded to the wafer 103, a portion of the die 101 may protrude from the wafer 103 and may be not included within the cavity 121, as shown in the figure. In these instances, the height of the cavity 121 can be less than the height of the die 101 and the thickness of the conductive layer 112.

In some examples, the region between the die and the walls (including the bottom) of the cavity 121 can be filled with a material 132 (step 362 of process 350). The region can be filled using any technique such as an epoxy injection method. FIG. 2D illustrates a cross-sectional view of an example integrated photonics device after the region between the die 101 and the walls of the cavity 121 are filled with a material 132. In some examples, the material 132 may be any type of acceptable index matching material such as an epoxy type material or an amorphous silicon material or any combination of materials as appropriate. The material 132 may be, e.g., injected through another side of the device not illustrated with the cross-sectional view of FIG. 2D. In some examples, the laser may include a ridge that is formed during step 358, and after step 362, the material 132 may be located around the ridge of the laser. In some instances, the conductive material that electrically connects the p-layer of the laser to the conductive layer 112 may be located between the die 101 and the material 132.

In step 364, as shown in FIG. 2E, a plurality of conductive posts 115 can be formed. The conductive posts 115 can deposited on the sides of the die 101. The conductive posts 115 can electrically connect to the conductive layer 112. The conductive posts 115 can be formed using any deposition technique. The conductive posts 115 can be formed with any height relative to the die 101; such as taller than, the same height as, or shorter than the die 101.

In some examples it may be desirable to deposit conductive posts on top of the die 101. With respect to FIGS. 2M-2O, these operations may be performed in the process between FIGS. 2E and 2F. In some examples, the operations of FIGS. 2M-2O may not be performed between FIGS. 2E and 2F. As illustrated in FIG. 2M and before material 133 is deposited, conductive posts 216, which in some examples may be metal posts or metal stud bumps may be deposited on top of the die 101. The conductive posts 216 may be gold or any other appropriate metal, conductive material and/or at least partially conductive material. Although three conductive posts 216 are illustrated in FIG. 2M, fewer or more conductive posts 216 may be used and the three conductive posts 216 are used for example only. Also in FIG. 2M, the portion of the die which may be above the wafer 103 may be approximately 0.12 millimeters, but this portion of the die 101 above the wafer 103 may change as appropriate.

In FIG. 2N, the conductive posts 115 on the wafer 103, the conductive posts 216 deposited on the die 101, along with the die, can be encapsulated using a material 133. The material 133 can be formed using any technique, such as those used for forming an overmold. The material 133 can be formed such that it surrounds the die 101, the conductive posts 216, and the conductive posts 115, as shown in FIG. 2N. The material 133 and the formation thereof will be discussed in further detail herein and with respect to FIG. 2F.

Next as illustrated in FIG. 2O, portions of the material 133, portions of the conductive posts 115, portions of the conductive posts 216, and portions of die 101 may be removed in a grinding step, followed by a polishing step. The grinding step can be used to remove portions of the material 133, portions of the conductive posts 115, portions of the conductive posts 216, and portions of the die 101. The amount removed can be based on the height of the conductive posts 216, the height of the conductive posts 115, the height of the die 101, or both. In some examples, the amount removed can be such that the top surfaces of the die 101, the conductive posts 216, and the conductive posts 115 are exposed. By removing portions of the material 133, portions of the die 101, portions of the conductive posts 216, and portions of the conductive posts 115, the silicon photonics circuit may be flip chip bonded as opposed to wire bonded. In some examples, the device 100 may be operably connected to one or more conducting materials via the exposed portions of the conductive posts 216 and the exposed portions of the conductive posts 115. The grinding and polishing steps will be discussed in further detail herein and with respect to FIG. 2G.

In some examples, the conductive layer 112 can be a layer of the wafer 103 (not shown), instead of being deposited inside the cavity (step 356 of FIG. 3). An example layer can be the SOI layer. The conductive layer 112 may be located within the wafer 103, and the conductive posts 115 can electrically connect to the conductive layer 112.

The conductive posts 115, along with the die, can be encapsulated using a material 133 (step 366 of process 350). The material 133 can be formed using any technique, such as those used for forming an overmold. The material 133 can be formed such that it surrounds the die 101 and the conductive posts 115, as shown in FIG. 2F. The material 133 can be any type of insulating material such as a dielectric material, a resin type material or a material based on silicon dioxide to lower the coefficient of thermal expansion. In some examples, the material 133 can be disposed on (including being in contact with) a component that it may be protecting from subsequent fabrication steps. One example component that the material 133 may be protecting is the die 101, and subsequent steps may include dicing the wafer 103 for separating multiple devices.

Step 368 can include a grinding step, followed by a polishing step. The grinding step can be used to remove portions of the material 133, portions of the die 101, and portions of the conductive posts 115. The amount removed can be based on the height of the conductive posts 115, the height of the die 101, or both. In some examples, the amount removed can be such that the top surfaces of the die 101 and the conductive posts 115 are exposed. By removing the material 133, portions of the die 101, and portions of the conductive posts 115, the silicon photonics circuit may be flip chip bonded as opposed to wire bonded. Further, by removing the aforementioned materials, a connection to a heat sink may also be achieved. Additionally, in some examples, optical connections may be made over the photonics integrated circuit due to the grinding and polishing steps and light may be directed in any direction from the die 101. In some examples, the amount removed from the die 101 can be based on a targeted thermal path. FIG. 2G illustrates the top surfaces of the die 101 and the conductive posts 115 as exposed. The polishing step can include any type of polishing technique such as chemical mechanical polishing (CMP).

In some examples, the order of the steps may be changed. For example, the material 133 can be formed to encapsulate the die 101 (step 366) before the plurality of conductive posts 115 are formed (step 364). After the material 133 is formed and portions of it are removed (step 368), holes can be drilled into the material 133 (not shown) and the holes can be filled with the conductive material for the conductive posts 115.

Once the top surfaces of the die 101 and the conductive posts 115 are exposed, a conductive layer 114 (e.g., second conductive layer) can be formed on these top surfaces (step 370 of process 350). The formation of the conductive layer 114 can include the deposition of the conductive material followed by a patterning step, such that a portion of the conductive layer 114 can be located on top of the die 101 and can serve as an electrode for the n-side contact of the light source. Another portion of the conductive layer can be located on top of the conductive posts 115, as shown in FIG. 2H, and may be optional. The formation of the conductive layer 114 can include a high-temperature annealing step in step 371, where the device 100 can be annealed at a temperature, e.g., greater than 300° C.

In some examples, one or more additional layers 116 can be deposited next to the conductive layer 114, as shown in FIGS. 2I-2J (step 372 of process 350).

One or more electrical contacts can be formed to electrically connect the conductive layer 114 to, e.g., a source such as a current source (step 374 of process 350). For example, as shown in FIG. 2K, a plurality of conductive bumps 118 can be formed on the conductive layer 114. The attached die 101 can be flipped over and bonded to an electrical chip using any bonding technique such as flip-chip bonding. The die 101 may also be in contact with a heat sink 110. In some examples, the electrical contacts can be wire bonds 119 that electrically connect to the conductive layer 114, as shown in FIG. 2L.

Edge Seal Examples

Figure 4A:
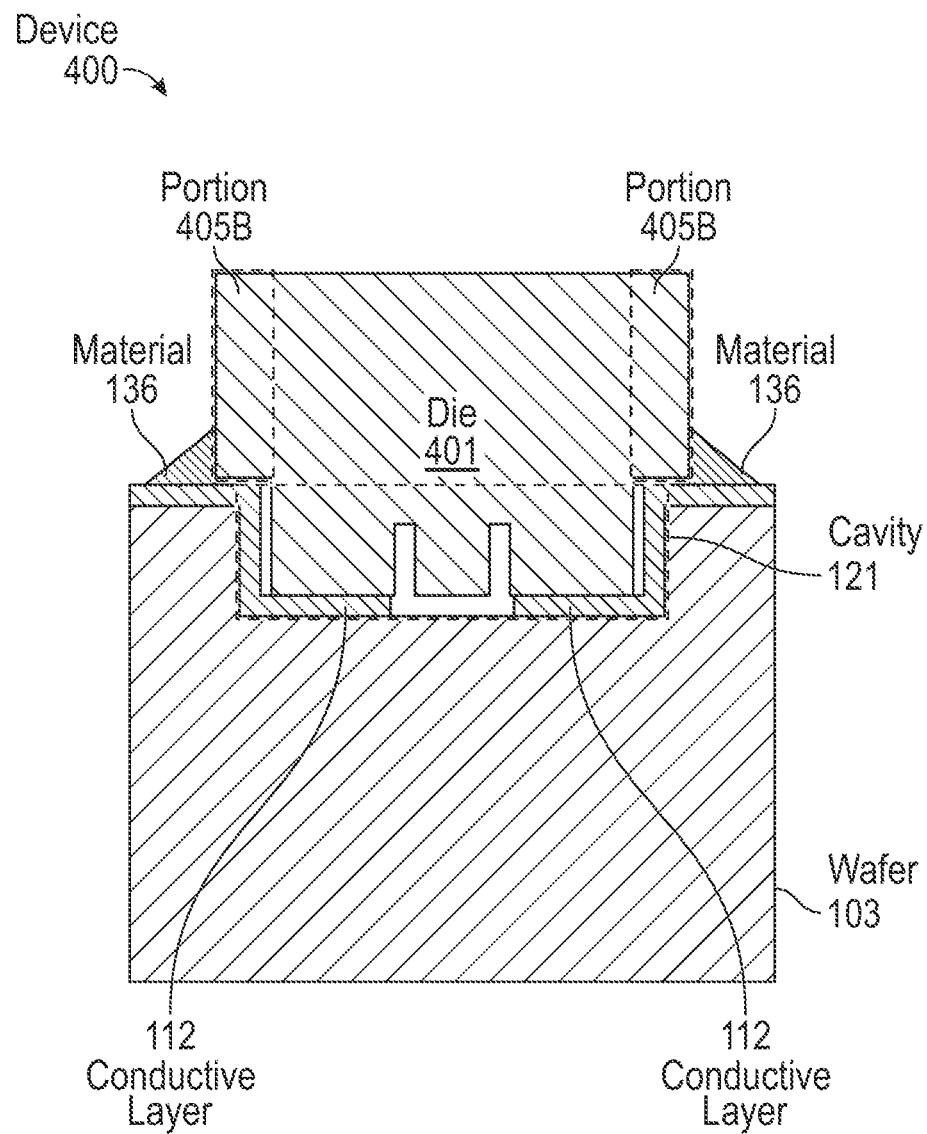
FIG. 4A illustrates a cross-sectional view of a portion of an example integrated photonics device during fabrication including an edge seal according to examples of the disclosure.

In some examples, the region between the die and the wafer may not be filled with a material (e.g., material 132 illustrated in FIG. 2D). One alternative option can be to use an edge seal. FIG. 4A illustrates a cross-sectional view of a portion of an integrated photonics device during fabrication including an edge seal according to examples of the disclosure. The device 400 can include a material 136 located between the walls of the die 401 and the top surface of portions of the conductive layer 112 located outside of the cavity 121.

Figure 4B:
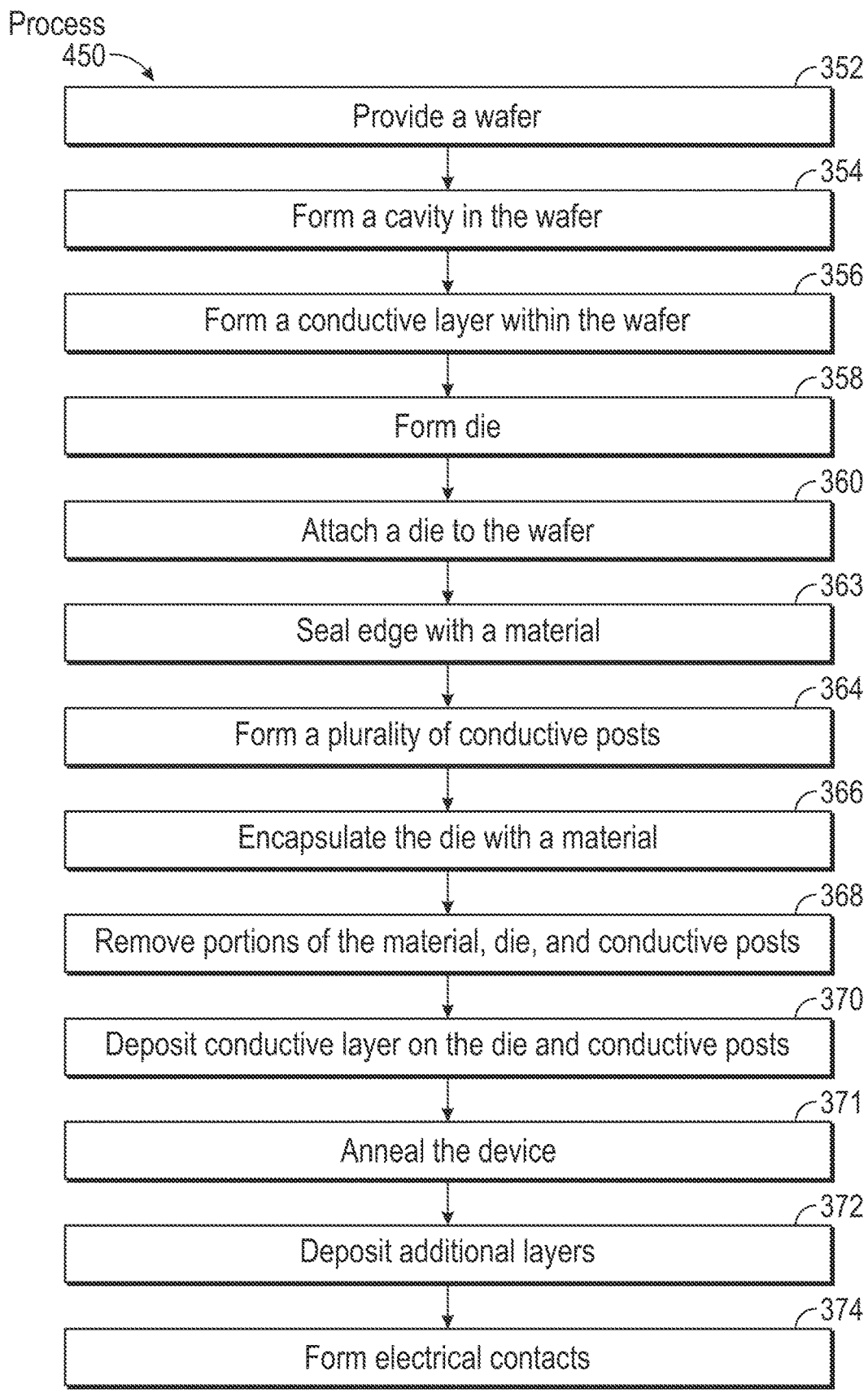
FIG. 4B illustrates an example process flow for fabricating a portion of an integrated photonics device including an edge seal according to examples of the disclosure.

Process 450 for forming the device 400 can include one or more steps similar to the process 350 for forming the device 100. FIG. 4B illustrates an example process 450, which can include step 352, step 354, step 356, step 358, step 360, step 364, step 366, step 368, step 370, step 371, step 372, and step 374 of process 350 (illustrated in FIG. 3). Process 450 may include a step 363, in which the material 136 can be formed such that it seals the edges of the die 401.

Figure 4C:
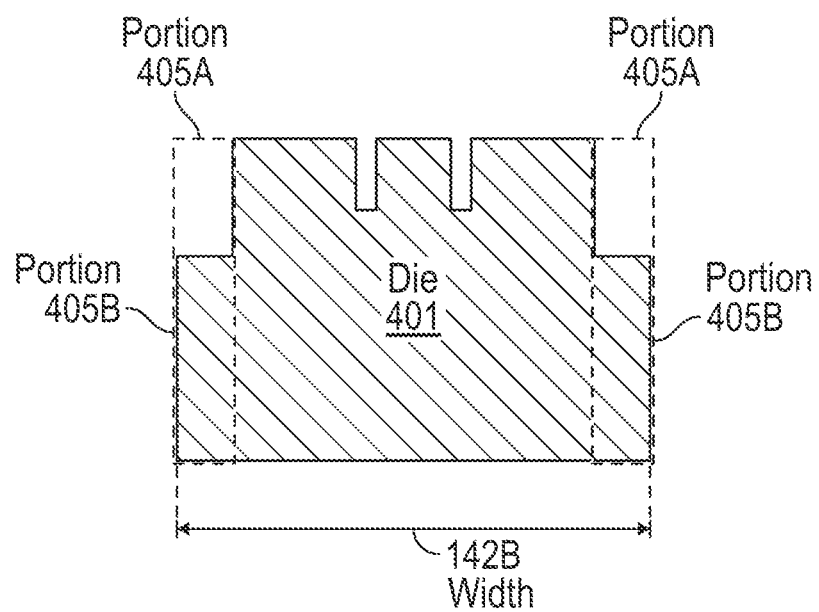
FIG. 4C illustrates a cross-sectional view of an example die to be integrated into an integrated photonics device including an edge seal according to examples of the disclosure.

In some examples, the die 401 can be formed (e.g., during step 358) such that portions 405A of the wafer 103 are removed to create a plurality of ledges from the portions 405B, as shown in FIG. 4C. The portions 405B that remain after the portions 405A are removed, can define the ledges and can be located outside of the cavity 121 when the die 101 is attached to the wafer 103, as shown in FIG. 4A. As such, the width 142B of the die 401 may be larger than the width of the cavity 121. In some examples, the portion 405B may be in the approximate range of 50 microns to 100 microns. In this manner, the material 136 in combination with the die 401 can seal the region between the die 401 and the top surfaces of the conductive layer 112. In some examples, the material 136 may be any appropriate material such as a resin or glue for example, as the material 136 may not be an optically functional material.

In other examples, the die 101 (as shown in FIG. 2B) may be used instead of the die 401 (not shown). In such instances, the die 101 may not include a plurality of ledges.

Example Configurations of the Electrical Contacts to the Light Source

In some instances, the annealing step of step 371 (illustrated in FIG. 3 and discussed above) may degrade one or more materials, such as the material 132 and the material 133 (illustrated in FIG. 1A), or the material 136 (illustrated in FIG. 4A). An alternative option can be to anneal the conductive layer 112 and the conductive layer 114 before the material 132 and the material 133 are deposited.

Figure 5A:
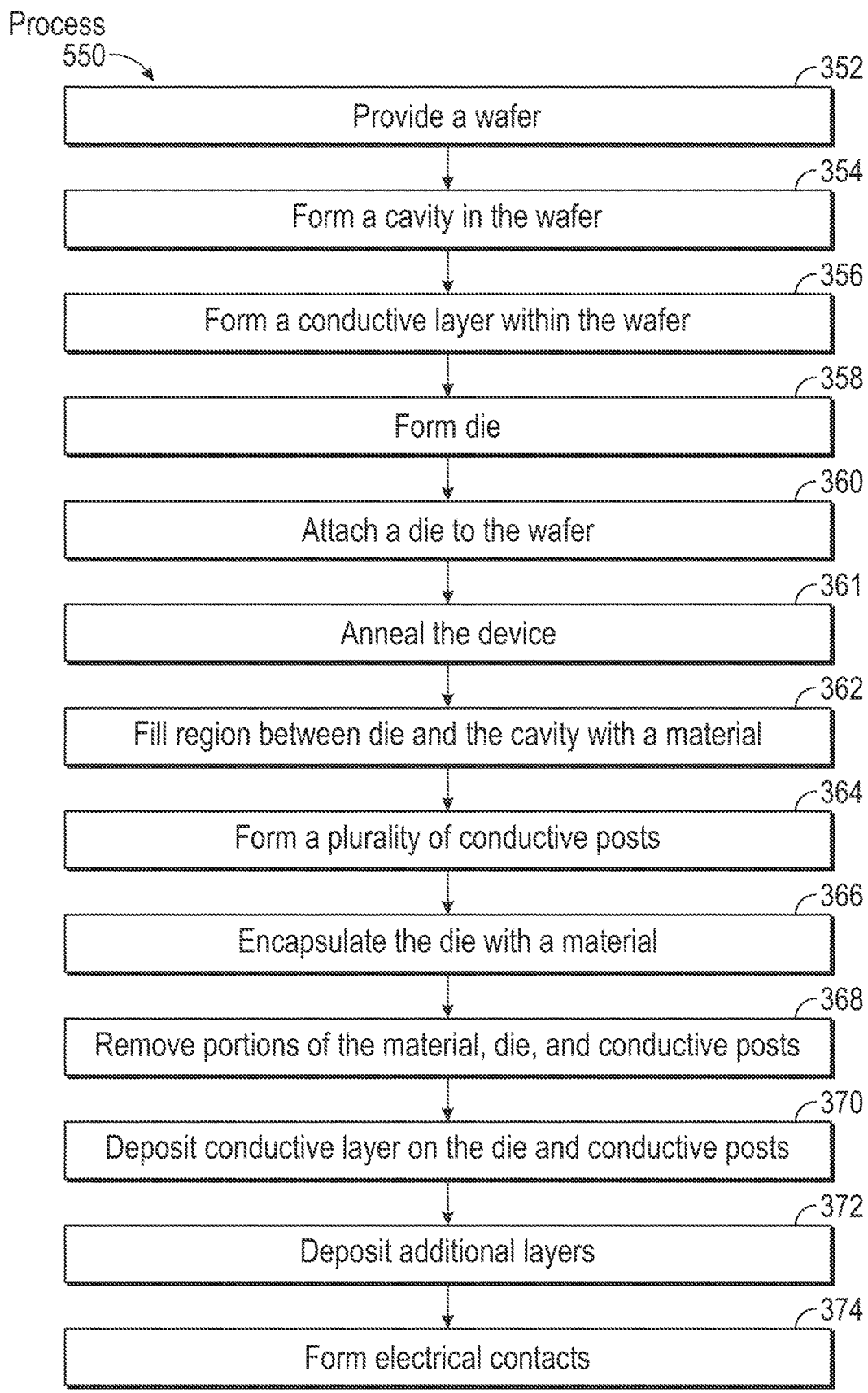
FIG. 5A illustrates an example process flow for fabricating a portion of an integrated photonics device including an annealing process before depositing an optical fill material according to examples of the disclosure.

Process 550 for forming the device 500 can include one or more steps similar to the process 350 for forming the device 100 and the process 450 for forming the device 400. FIG. 5A illustrates an example process 550, which can include step 352, step 354, step 356, step 358, step 360, step 362, step 364, step 366, step 368, step 370, step 372, and step 374 of process 350 (illustrated in FIG. 3). In some examples, the process 550 can include step 363 of FIG. 4B (not shown). Process 550 may include an alternative step 361, in which the device may be annealed before the material 132, the material 133, and/or the material 136 is deposited.

In some examples, the die 501 can be formed (e.g., during step 358) such that a portion 407 of the die 501 is removed. The removed portion 407 can create an opening from the top side of the die (e.g., where the p-side of the light source is located) through the active region 501A to the n-layer of the light source, as shown in FIG. 5B. A conductive layer 117 can be formed in a portion of the opening. The conductive layer 117 can be deposited such that electrical contact can be made to the n-layer of the light source (and not the p-side).

Figure 5C:
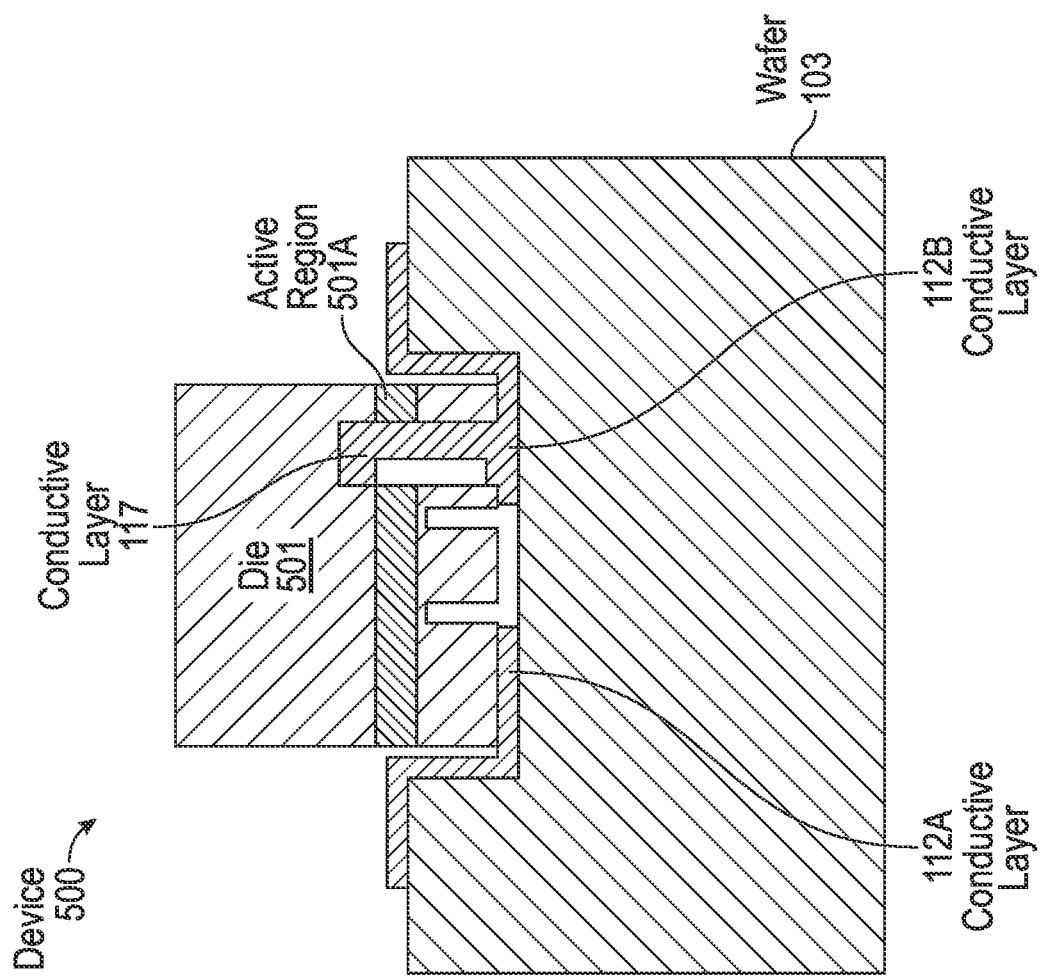
FIGS. 5C-5D illustrate cross-sectional views of an example integrated photonics device including an electrical connection to the n-side contact of the light source on the same side as the electrical connection to the p-side contact during fabrication according to examples of the disclosure.
Figure 5B:
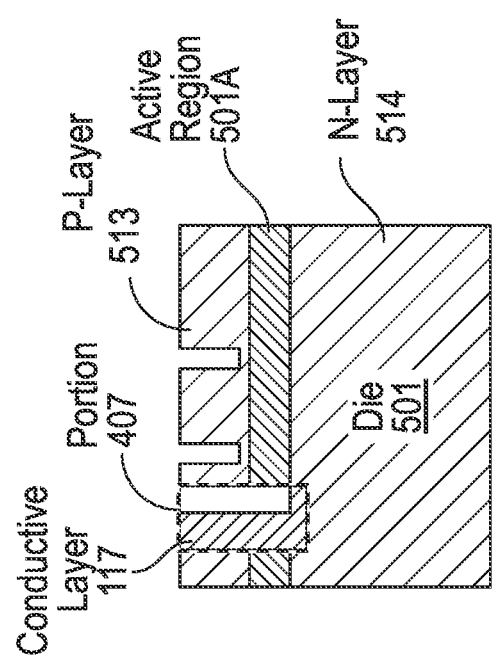
FIG. 5B illustrates a cross-sectional view of an example die to be integrated into an integrated photonics device including an electrical connection to the n-side contact of the light source on the same side as the electrical connection to the p-side contact according to examples of the disclosure.

FIG. 5C illustrates step 360 where the die 501 can be flipped over and bonded to the wafer 103. The conductive layer 112 previously formed in step 356 can be patterned into multiple portions: conductive layer 112A and conductive layer 112B. When the die 501 is bonded to the wafer 103, the conductive layer 117 of the die 501 can make electrical contact with the conductive layer 112B.

The process 550 can proceed with an annealing step in step 361, which can include a high-temperature annealing process similar to the one in step 371 of FIG. 3 and FIG. 4B. The annealing step in step 361 may differ from that in step 371 with its order among the other steps of its corresponding process. In some examples, the die 501 may be annealed, as part of step 358, before being attached to the wafer 103. The wafer may also be annealed, but separately from the die 501, as part of step 356.

Figure 5D:
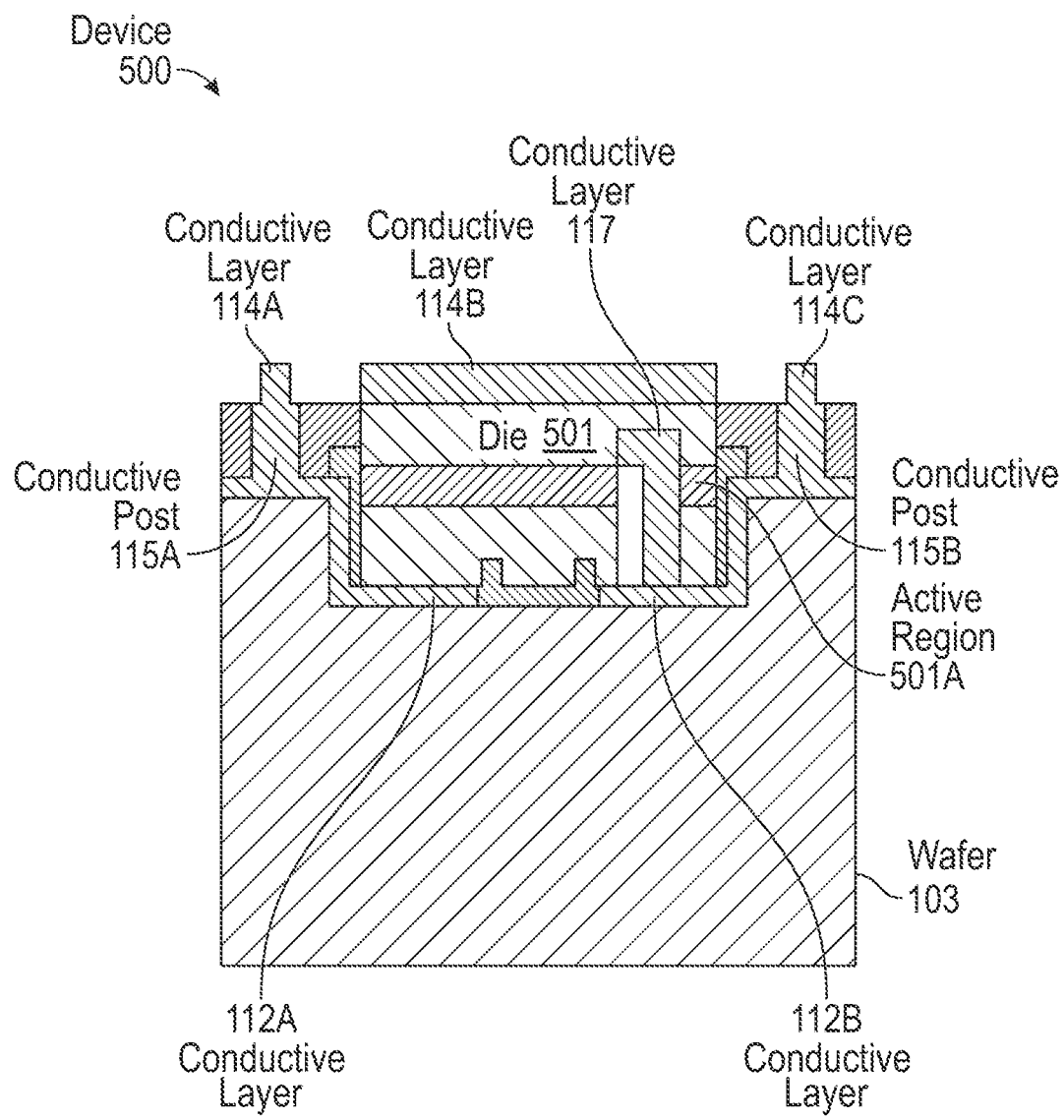

The process 550 may also proceed with step 362, step 364, step 366, step 368, and step 370. FIG. 5D illustrates a cross-sectional view of the device after step 370. In step 370, a conductive material can be deposited and patterned into the conductive layer 114A, the conductive layer 114B, and the conductive layer 114C.

The conductive layer 114A can electrically connect to the conductive post 115A, and the conductive layer 114C can electrically connect to the conductive post 115B. Electrical contacts (e.g., the electrical connection 111 and the electrical connection 113 illustrated in FIGS. 1A-1B) can be formed in a subsequent step 374, where an electrical connection to the conductive layer 114A can be used to make contact with the p-side contact of the light source. Additionally, an electrical connection to the conductive layer 114C can be used to make contact with the n-side contact of the light source. In this manner, an electrical connection to the n-side contact of the light source can be on the same side (e.g., top surface) of the die 501 as an electrical connection to the p-side contact.

In some examples, the device 500 may not include the conductive layer 114B.

Fabrication of an Example Outcoupler

Figure 6B:
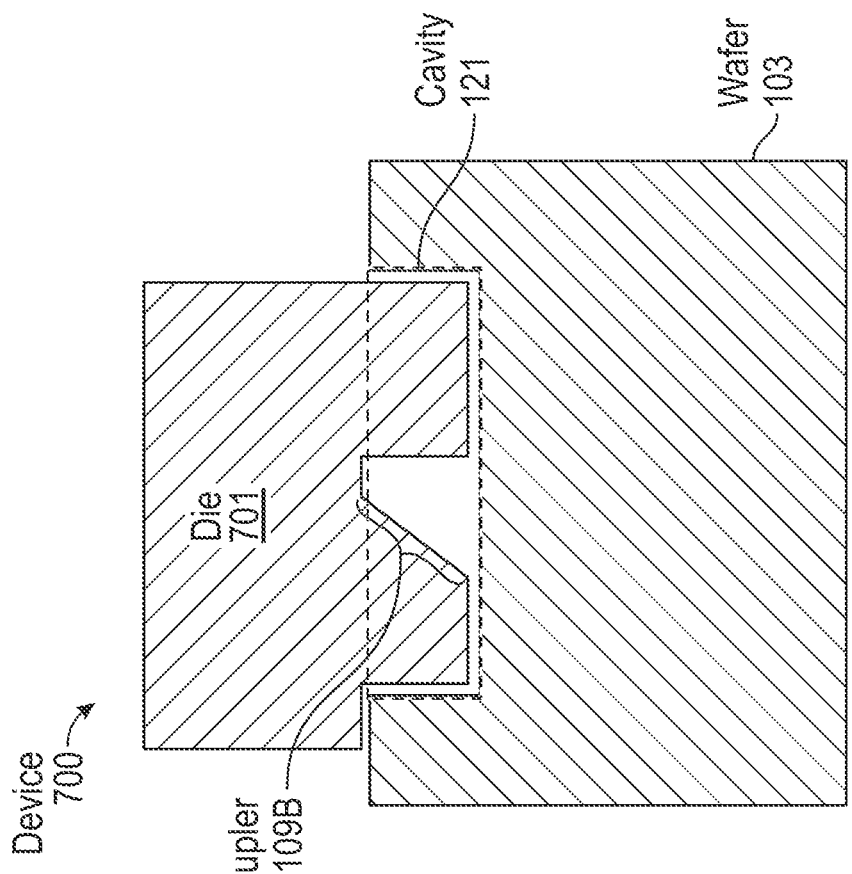
FIGS. 6A-6B illustrate cross-sectional views of portions of example integrated photonics devices including outcouplers during fabrication according to examples of the disclosure.
Figure 6A:
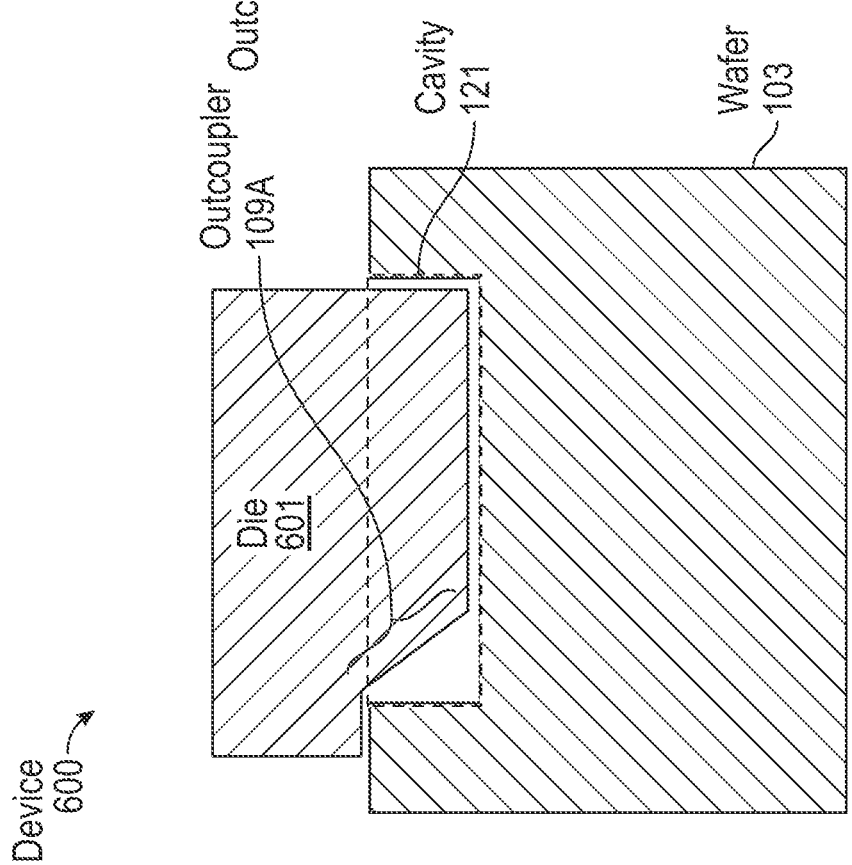

In some examples, the optical chip can include an outcoupler, which can be fabricated using one or more steps similar to those of process 350, process 450, and/or process 550. FIGS. 6A-6B illustrate cross-sectional views of portions of example integrated photonics devices including outcouplers during fabrication according to examples of the disclosure.

The device 600 of FIG. 6A can include a die 601, which can include an outcoupler 109A. The outcoupler 109A can be a downward emitting outcoupler; it can redirect incident light towards the bottom of the wafer 103.

The device 700 of FIG. 6B can include a die 701, which can include an outcoupler 109B. The outcoupler 109B can be an upward emitting outcoupler; it can redirect incident light towards the other side of the die 701.

The die 601 and the die 701 can be attached to a corresponding wafer 103 and at least a portion of it can be located within a cavity 121 of the corresponding wafer 103.

Examples of Caps

Figure 7A:
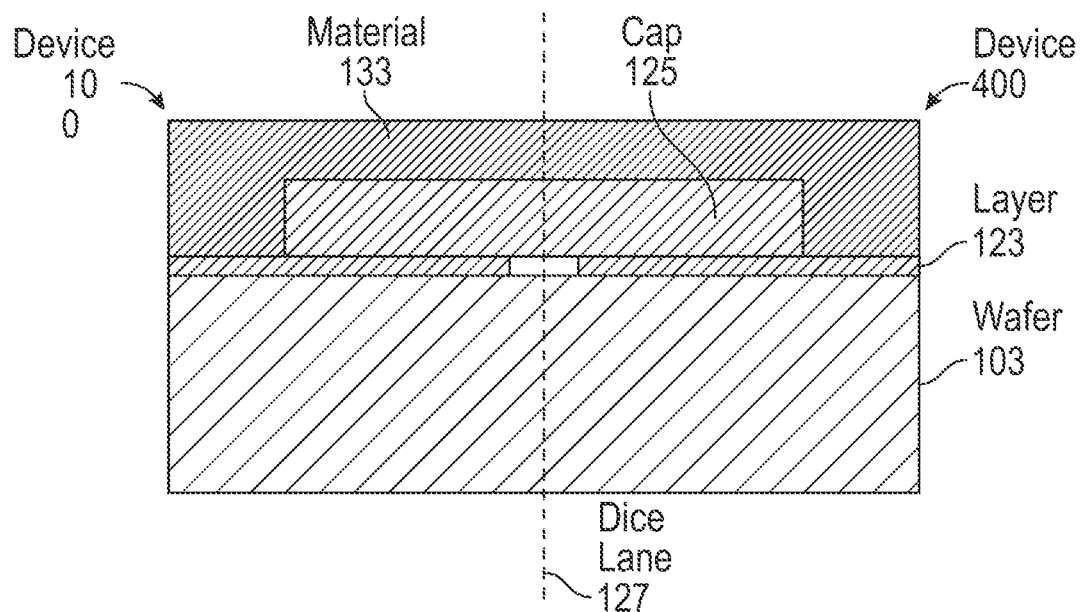
FIGS. 7A-7B illustrate cross-sectional views of portions of exemplary integrated photonics devices including caps according to examples of the disclosure.
Figure 7B:
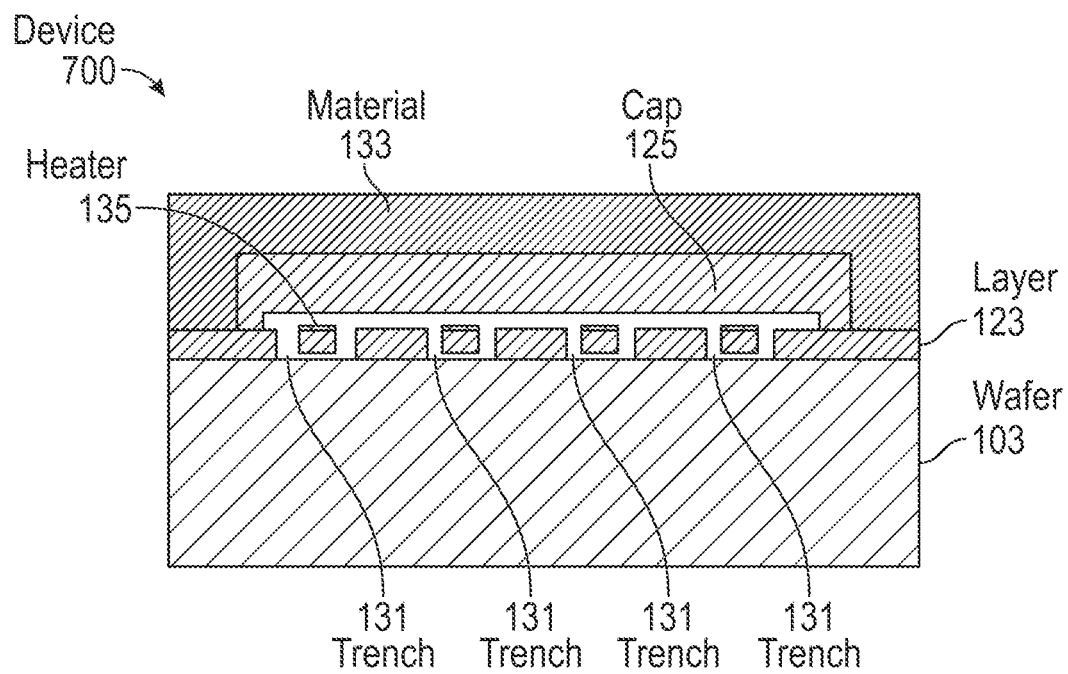

In some instances, the photonics device can include one or more caps to protect one or more components included in the PIC. FIGS. 7A-7B illustrate cross-sectional views of portions of example integrated photonics devices including caps according to examples of the disclosure. In some examples, a cap can be used to protect one or more layers from a subsequent fabrication process such as dicing. FIG. 7A illustrates a wafer 103 that may include multiple devices such as device 100 and device 400, for example. The wafer 103 may undergo one or more of the same fabrication processes and may later be separated into multiple devices using a dicing process.

The wafer 103 can include a cap 125. The cap 125 may be disposed on or in contact with one or more components that the cap is protecting. An example component is a layer 123. The layer 123 can include, but is not limited to, a SOI layer that is used as a waveguide. In some examples, the layer 123 may include an air gap located between the layer 123 of the different devices.

One or more materials such as solder, epoxy, or an adhesive film can be used to attach the cap 125 to the wafer 103. A material 133 may be formed to encapsulate the cap, and in this manner, the cap 125 can be embedded in the device (e.g., located between the material 133 and a corresponding PIC component that the cap 125 is protecting). The device 100 and the device 400 may then be separated at the dice lane 127, and the cap 125 can protect the layer 123 from the dicing process. Specifically, the cap 125 may protect the etched facet of the layer 123. In some examples, after the device 100 and the device 400 are separated, the edge of layer 123 may be located further from the edge of the device (e.g., defined by the dice lane 127), which may facilitate preservation of the etched facet.

The cap 125 can include any type of material that protects the PIC components. Example materials can include, but are not limited to, silicon, glass, etc. In some examples, the material for the cap 125 may have a thermal expansion coefficient that is similar to the layer 123. Additionally, the cap can be used to create a planar PIC. In some instances, the height of the cap can be determined based on the height of the other PIC components.

A cap can be used for other purposes such as improving the performance of the device. In the example of FIG. 7B, the device 700 can include a plurality of heaters 135 used to heat one or more PIC components (e.g., a grating, a waveguide, etc.) and a plurality of trenches 131 located under the heaters 135. The plurality of trenches 131 can be formed by etching a portion of the layer 123. In some instances, the plurality of trenches 131 may not be filled with a material and may include air. The device 700 can include a cap 125 that can enclose the region around the PIC component, thereby reducing the amount of heat dissipation. This enclosed region may improve the efficiency of the heater.

In some examples, the cap 125 may be formed to have one or more shapes, such as the inverted cavity shown in FIG. 7B. The depth of the inverted cavity can be selected based on any number of factors such as the number of the trenches 131, the number of heaters 135, the thermal performance of the heaters 135, etc.

Examples of the disclosure can include a die that includes one or more light sources, one or more outcouplers, one or more caps, or a combination thereof. The die can be formed, attached to the wafer, and fabricated to include two or three of the light source, outcoupler, and cap, using the above-described processes.

Representative applications of methods and apparatus according to the present disclosure are described in this section. These examples are being provided solely to add context and aid in the understanding of the described examples. It will thus be apparent to one skilled in the art that the described examples may be practiced without some or all of the specific details. Other applications are possible, such that the following examples should not be taken as limiting.

A method for forming an integrated photonics device is disclosed. The method may comprise: providing a wafer; forming a cavity in the wafer, the cavity including a bottom; providing a die, the die including at least a portion of a laser; forming a first conductive layer within the wafer; attaching the die to the bottom of the cavity of the wafer, wherein a p-side of the laser is located closer to the bottom of the cavity than an n-side of the laser when the die is attached to the wafer; encapsulating the attached die using a first insulating material; removing a portion of the die and a portion of the first insulating material; and forming electrical connections to the die. Additionally or alternatively, in some examples, the method further comprises: filling a region between the die and the cavity with an optical fill material. Additionally or alternatively, in some examples, the method further comprises: forming an edge seal between the die and a second portion of the first conductive layer, wherein the second portion of the first conductive layer is located outside of the cavity of the wafer. Additionally or alternatively, in some examples, the method further comprises: forming a plurality of conductive posts, the plurality of conductive posts electrically connecting the laser to the electrical connections. Additionally or alternatively, in some examples, a first set of the plurality of conductive posts is adjacent to the wafer and a second set of conductive posts is adjacent to the die. Additionally or alternatively, in some examples, the removal of the portion of the die and the portion of the first insulating material further comprises removing a portion of the plurality of conductive posts, wherein the portion of the die, the portion of the first insulating material, and the portion of the plurality of conductive posts are removed simultaneously. Additionally or alternatively, in some examples, the formation of the electrical connections to the die includes: forming a plurality of conductive bumps onto the attached die; flipping the attached die; and bonding the plurality of conductive bumps to an electrical chip. Additionally or alternatively, in some examples, the formation of the electrical connections to the die includes forming a plurality of wire bonds from the attached die to an electrical chip. Additionally or alternatively, in some examples, forming the first conductive layer includes depositing a conductive material such that a first portion of the conductive material is located inside the cavity of the wafer and a second portion of the conductive material is located outside the cavity. Additionally or alternatively, in some examples, the providing of the die includes removing portions of the die to create a plurality of ledges. Additionally or alternatively, in some examples, the method further comprises annealing the attached die before the encapsulation. Additionally or alternatively, in some examples, forming the first conductive layer within the wafer includes: forming a first portion of the first conductive layer, and forming a second portion of the first conductive layer; and wherein the providing of the die includes: removing a portion of the die to create an opening, depositing a second conductive layer in the opening, and electrically connecting the second portion of the first conductive layer to the second conductive layer. Additionally or alternatively, in some examples, the formation of the electrical connections to the die includes electrically connecting an electrical chip to both a p-side and a n-side of laser through the first conductive layer.

An integrated photonics device is disclosed. In some examples, the integrated photonics device includes: a die including at least a portion of a laser, the laser including a p-layer and an n-layer; a wafer including a cavity, the cavity including a bottom, wherein the p-layer of the laser is located closer to the bottom of the cavity than the n-layer of the laser when the die is attached to the wafer; a first conductive layer located within the wafer; a first insulating material that surrounds at least portions of sides of the die; a plurality of conductive posts, wherein the plurality of conductive posts include a first conductive post electrically connected to the first conductive layer; a second insulating material that surrounds the plurality of conductive posts; and a plurality of electrical connections, the plurality of electrical connections connecting the laser to an electrical chip. Additionally or alternatively, in some examples, the plurality of electrical connections include a plurality of conductive bumps or a plurality of wire bonds. Additionally or alternatively, in some examples, a width of the die is greater than a width of the cavity, and wherein the die includes a plurality of ledges. Additionally or alternatively, in some examples, the first insulating material seals the plurality of ledges. Additionally or alternatively, in some examples, the die includes an opening, and a second conductive layer located within the opening, further wherein the first conductive layer includes a first portion and a second portion, the second portion of the first conductive layer is electrically connected to the second conductive layer, and further wherein the plurality of electrical connections connects a contact to the n-layer of the laser and a contact to the p-layer of the laser to the electrical chip at a same side of the die. Additionally or alternatively, in some examples, the plurality of conductive posts includes a second conductive post electrically connected to the second conductive layer. Additionally or alternatively, in some examples, the plurality of conductive posts includes a third conductive post on the die. Additionally or alternatively, in some examples, the die further includes an outcoupler. Additionally or alternatively, in some examples, the integrated photonics device further comprises: one or more components; and one or more caps, wherein the one or more caps are attached to the wafer, wherein the one or more caps protect the one or more components and are located between the one or more components and the first insulating material. Additionally or alternatively, in some examples, the one or more components include a waveguide, and further wherein the one or more caps protect an etched facet of the waveguide. Additionally or alternatively, in some examples, the integrated photonics device further comprises: one or more caps and a plurality of heaters, wherein the one or more caps are located between the first insulating material and the plurality of heaters, further wherein the one or more caps are attached to the wafer and create an enclosed region including the plurality of heaters.

Although the disclosed examples have been fully described with reference to the accompanying drawings, it is to be noted that various changes and modifications will become apparent to those skilled in the art. Such changes and modifications are to be understood as being included within the scope of the disclosed examples as defined by the appended claims.

What is claimed is:

1. A method for forming an integrated photonics device, the method comprising:
    providing a wafer;
    forming a cavity in the wafer, the cavity including a bottom;
    providing a die, the die including a laser;
    forming a first conductive layer within the wafer;
    attaching the die to the bottom of the cavity of the wafer; and
    forming an edge seal between the die and a second portion of the first conductive layer, wherein the second portion of the first conductive layer is located outside of the cavity of the wafer.

2. The method of claim 1, wherein:
    the method further comprises:
        forming electrical connections to the die;
        encapsulating the attached die using a first insulating material;
        removing a portion of the die and a portion of the first insulating material; and
    a p-side of the laser is located closer to the bottom of the cavity than an n-side of the laser when the die is attached to the wafer.

3. The method of claim 2, further comprising:
    forming a plurality of conductive posts, the plurality of conductive posts electrically connecting the laser to the electrical connections.

4. The method of claim 3, wherein a first set of the plurality of conductive posts is adjacent to the wafer and a second set of conductive posts is adjacent to the die.

5. The method of claim 3, wherein the removal of the portion of the die and the portion of the first insulating material further comprises removing a portion of the plurality of conductive posts, wherein the portion of the die, the portion of the first insulating material, and the portion of the plurality of conductive posts are removed simultaneously.

6. The method of claim 2, comprising forming electrical connections to the die, wherein forming the electrical connections to the die includes forming a plurality of wire bonds from the attached die to an electrical chip.

7. The method of claim 1, comprising forming electrical connections to the die, wherein forming the electrical connections to the die includes:
    forming a plurality of conductive bumps onto the attached die;
    flipping the attached die; and
    bonding the plurality of conductive bumps to an electrical chip.

8. The method of claim 1, wherein:
    forming the first conductive layer includes:
        depositing a conductive material such that a first portion of the conductive material is located inside the cavity of the wafer; and
        a second portion of the conductive material is located outside the cavity.

9. The method of claim 1, wherein the providing of the die includes removing portions of the die to create a plurality of ledges.

10. The method of claim 1, further comprising:
    encapsulating the attached die using a first insulating material; and
    annealing the attached die before the encapsulation.

11. The method of claim 1, wherein forming the first conductive layer within the wafer includes:
    forming a first portion of the first conductive layer, and forming the second portion of the first conductive layer; and
    wherein the providing of the die includes:
        removing a portion of the die to create an opening,
        depositing a second conductive layer in the opening, and
        electrically connecting the second portion of the first conductive layer to the second conductive layer.

12. The method of claim 11, comprising forming electrical connections to the die, wherein forming the electrical connections to the die includes electrically connecting an electrical chip to both a p-side and an n-side of the laser through the first conductive layer.

13. A method for forming an integrated photonics device with an outcoupler, the method comprising:
providing a wafer;
forming a cavity in the wafer, the cavity including a bottom;
providing a die, the die including an outcoupler for redirecting light;
positioning the outcoupler to redirect the light towards a bottom of the wafer
attaching the die to the bottom of the cavity of the wafer;
encapsulating the attached die using a first insulating material; and
removing a portion of the die and a portion of the first insulating material.

14. The method of claim 13, further comprising:
depositing a cap; and
forming electrical connections to the die, wherein the die includes a laser.

15. The method of claim 14, further comprising:
forming an encapsulation layer over the cap.

16. The method of claim 14, wherein the cap is formed over a facet.

17. The method of claim 14, wherein the method further comprises depositing the cap over multiple heaters thereby reducing heat dissipation.

18. The method of claim 17, wherein:
the method further comprises etching multiple trenches; and
each trench of the multiple trenches is adjacent to a corresponding heater of the multiple heaters.

* * * * *